United States Patent
Kraut et al.

(10) Patent No.: US 12,166,289 B2
(45) Date of Patent: Dec. 10, 2024

(54) PHASE SHIFTER SYSTEM AND METHOD

(71) Applicant: Infineon Technologies AG, Neubiberg (DE)

(72) Inventors: Gunther Kraut, Egmating (DE); Jonas Eric Sebastian Fritzin, Munich (DE)

(73) Assignee: Infineon Technologies AG, Neubiberg (DE)

( * ) Notice: Subject to any disclaimer, the term of this patent is extended or adjusted under 35 U.S.C. 154(b) by 778 days.

(21) Appl. No.: 17/332,247

(22) Filed: May 27, 2021

(65) Prior Publication Data

US 2021/0376466 A1 Dec. 2, 2021

(30) Foreign Application Priority Data

May 29, 2020 (DE) .......................... 102020206800.3

(51) Int. Cl.
 *H01Q 3/38* (2006.01)
 *G01S 7/282* (2006.01)
 *G01S 13/931* (2020.01)

(52) U.S. Cl.
 CPC ............... *H01Q 3/38* (2013.01); *G01S 7/282* (2013.01); *G01S 13/931* (2013.01)

(58) Field of Classification Search
 CPC .............. G01S 13/02; G01S 13/931; G01S 2013/0254; G01S 7/03; G01S 7/282; H01Q 3/38; H03H 2210/025; H03H 2210/033; H03H 2210/036; H03H 7/20; H03H 7/21
 See application file for complete search history.

(56) References Cited

U.S. PATENT DOCUMENTS

| | | | | |
|---|---|---|---|---|
| 4,085,288 A * | 4/1978 | Viswanathan | ...... | H04L 25/4906 455/337 |
| 4,875,089 A * | 10/1989 | Judge | ..................... | H04N 17/02 348/441 |
| 5,923,714 A * | 7/1999 | Hwang | ..................... | H04L 1/02 375/267 |
| 5,994,985 A * | 11/1999 | Pehlke | ..................... | H03J 3/16 336/200 |
| 11,906,617 B2 * | 2/2024 | Vacanti | ................. | G01S 13/584 |
| 2001/0027092 A1 * | 10/2001 | Muschallik | ......... | H04L 27/2657 455/260 |
| 2002/0164961 A1 * | 11/2002 | Atkinson | ............... | H04B 1/403 455/84 |

(Continued)

FOREIGN PATENT DOCUMENTS

| | | |
|---|---|---|
| DE | 2502950 A1 | 7/1976 |
| DE | 2139039 B2 | 8/1977 |
| DE | 102018112092 A1 | 7/2019 |

*Primary Examiner* — Thien M Le
(74) *Attorney, Agent, or Firm* — Slater Matsil, LLP

(57) ABSTRACT

A phase shifter for adjusting a phase shift between an input signal and output signal of the phase shifter includes: a first signal path between the input and the output; a second signal path between the input and the output; and a phase-shifter circuit configured to shift a phase of a first signal of the first signal path and a phase of a second signal of the second signal path by a constant phase angle relative to each other. The first and second signal paths each comprise a voltage-divider circuit connected to its respective signal path and configured to adjust an amplitude of a signal of the respective signal path. The output signal is based on a combination of the first signal and the second signal.

20 Claims, 16 Drawing Sheets

(56) References Cited

U.S. PATENT DOCUMENTS

| | | | |
|---|---|---|---|
| 2003/0119474 A1* | 6/2003 | Kimura | H03D 7/1433 |
| | | | 455/333 |
| 2009/0256740 A1* | 10/2009 | Teshirogi | H01Q 9/27 |
| | | | 342/204 |
| 2019/0214724 A1 | 7/2019 | Schrattenecker et al. | |
| 2021/0175589 A1* | 6/2021 | Patel | H03H 11/20 |
| 2024/0014786 A1* | 1/2024 | Balteanu | H03F 1/0227 |

* cited by examiner

PHASE SHIFTER SYSTEM AND METHOD

This application claims the benefit of German Application No. 102020206800.3, filed on May 29, 2020, which application is hereby incorporated herein by reference in its entirety.

TECHNICAL FIELD

Examples of the present disclosure relate to a phase shifter. Further examples relate to a method for adjusting a phase shift between an alternating input signal and an output signal. Further examples of the present disclosure relate to a radar transmitter and, specifically, to integrated circuits for vehicle radar applications, and also to a method for providing a radar signal.

BACKGROUND

Phase shifters are typically used for shifting the phase of an alternating signal. For example, phase shifters are used in radar systems, which can be employed for vehicles, for instance. Radar systems often comprise a certain number of transmit channels (TX) and receiver channels (RX) in order to allow directional reception and also shaping of the radar wave. For this purpose, the TX signals need to be phase-shifted by a reliable, stable phase relationship between the TX channels.

Phase-shifter circuits in conventional radar chips often consist of what is known as an I/Q modulator structure. Both the I-path (in-phase component) and the Q-path (quadrature component) contain a multiplier for modifying the I and Q radiofrequency (RF) levels under the control of an analog DC signal. This analog DC voltage is produced by a digital-to-analog converter in order to allow digital control by means of I and Q programming words di and do respectively. Every point in the I/Q constellation diagram can be obtained by this means, i.e. the phase of an RF input signal can be altered between 0° and 360°.

SUMMARY

Examples of a first aspect of the present disclosure provide a phase shifter for adjusting, on the basis of a plurality of control signals, a phase shift between an alternating input signal present at an input of the phase shifter and an output signal of the phase shifter provided at an output of the phase shifter, comprising a first signal path between the input and the output, a second signal path between the input and the output, and a phase-shifter circuit designed to shift a phase of a first signal of the first signal path and a phase of a second signal of the second signal path by a constant phase angle relative to each other. The first and second signal paths each comprise a voltage-divider circuit, which is connected in the respective signal paths in order to adjust an amplitude of the signal of the respective signal paths according to respective amplitude control signals of the plurality of control signals. The output signal is based on a combination of the first and second signals.

Examples of the first aspect of the present disclosure are based on the finding that the voltage-divider circuit allows very precise and stable adjustment of an amplitude of an alternating signal, whereby the phase shift between the alternating input signal and the output signal can be adjusted very precisely. The voltage-divider circuit can be designed according to the application such that a phase-shift adjustment precision required for the application can be achieved. In particular, the voltage-divider circuit can be designed to allow very precise adjustment of the phase shift. At the same time, the voltage-divider circuit offers a very simple implementation facility for adjusting the amplitudes of the first and second signals. This minimizes the requirements placed on the hardware design of the phase shifter and allows a space-saving implementation, for instance on a semiconductor chip. Using the voltage-divider circuits means it is possible to avoid active analog components such as digital-to-analog converters, which consume power and/or can exhibit analog inaccuracies in terms of the phase precision. In contrast, the voltage-divider circuits can be implemented so as to have very low, or even zero, power consumption. In addition, the voltage-divider circuit can offer particularly good stability with respect to changing conditions, for instance with respect to a changing temperature, which means, for example, that the variation in the phase of the output signal with respect to temperature can be small. Time-consuming, power-consuming and space-consuming calibration can thereby be largely avoided.

Examples of a second aspect of the present disclosure provide a phase shifter for adjusting, on the basis of a plurality of control signals, a phase shift between an alternating input signal present at an input of the phase shifter and an output signal of the phase shifter provided at an output of the phase shifter, comprising a first signal path between the input and the output, a second signal path between the input and the output, and a phase-shifter circuit designed to shift a phase of a first signal of the first signal path and a phase of a second signal of the second signal path by a constant phase angle relative to each other. The first signal path comprises a number of parallel-connected first sub-signal paths for respective first sub-signals, which first sub-signals are based on the first signal, and the second signal path comprises a number of parallel-connected second sub-signal paths for respective second sub-signals, which second sub-signals are based on the second signal. The first and second sub-signal paths each comprise an amplitude adjustment unit, wherein the respective amplitude adjustment units are connected in the respective sub-signal paths in order to adjust an amplitude of the respective sub-signals according to respective amplitude control signals of the plurality of control signals. The output signal is based on a combination of a plurality, or all, of the first and second sub-signals, wherein the phase shifter comprises a combiner circuit, which is designed to switch the first and second sub-signals in different ways according to respective switching control signals of the plurality of control signals in order to adjust the combination of the first and second sub-signals. The amplitude adjustment units in the first and second sub-signal paths are designed to adjust the amplitudes of the first and second sub-signals according to the amplitude control signals such that a phase shift, relative to the alternating input signal, of a signal that can be obtained by a first combination of the first and second sub-signals equals a value within a predetermined phase sector, which value is defined by the amplitude control signals. The combiner circuit is designed to switch the first and second sub-signals so as to shift the defined value into a phase sector defined by the switching control signals. For example, the combiner circuit is designed to switch the first and second sub-signals such that, according to the switching by the combiner circuit, a particular sub-signal of the sub-signals contributes to the output signal, wherein the particular sub-signal can be switched such that a phase of said sub-signal can, or cannot, be shifted by a half period, or does not contribute to the output signal.

Examples of the second aspect of the present disclosure are based on the finding that by combining the first and second sub-signals, a phase shift achievable by the amplitude adjustment units within a predetermined phase sector can be shifted from the predetermined phase sector into a desired phase sector. The amplitude adjustment units can hence be designed such that an adjustment of the amplitudes of the first and second sub-signals by means of the amplitude adjustment units can adjust a phase shift, relative to the alternating input signal, of a signal that can be obtained by a first combination of the first and second sub-signals solely to values within the predetermined phase sector. It is thereby possible to select the predetermined phase sector, within which the phase shift can be adjusted by the amplitude adjustment units, to be smaller than a phase range containing values for the phase shift to be achieved in an application. The amplitude adjustment units can hence be designed such that the amplitudes of the first and second sub-signals can be adjusted solely in a smaller range, thereby allowing a more economical design of the amplitude adjustment units in terms of space and power. In examples of amplitude adjustment units, it is hence possible to reduce the phase-shifter noise, thereby increasing the precision of the output signal.

Examples of the first and second aspects provide a radar transmitter comprising an oscillator designed to provide a local oscillator signal, also comprising a plurality of transmitter channels, wherein each of the transmitter channels is designed to provide an antenna signal on the basis of the local oscillator signal. The transmitter channels each contain a phase shifter according to the first or second aspect, wherein each of the transmitter channels is designed to provide the local oscillator signal at the input of the phase shifter, and to provide, on the basis of the output signal from the phase shifter, the antenna signal of the transmitter channel. The radar transmitter is also designed to provide for each of the phase shifters the corresponding plurality of control signals in order to adjust a phase relationship between the antenna signals.

Further examples of the first aspect of the disclosure provide a method for adjusting a phase shift between an alternating input signal and an output signal on the basis of a plurality of control signals, comprising: providing a first signal, which is based on the alternating input signal, and a second signal, which is based on the alternating input signal; shifting a phase of the first signal and a phase of the second signal by a constant phase angle relative to each other; adjusting division ratios for respective voltage-divider circuits for the first and second signals according to respective amplitude control signals of the plurality of control signals in order to adjust respective amplitudes of the first and second signals; combining the first and second signals in order to provide the output signal.

Further examples of the second aspect of the disclosure provide a method for adjusting a phase shift between an alternating input signal and an output signal on the basis of a plurality of control signals, comprising: providing a first signal, which is based on the alternating input signal, and a second signal, which is based on the alternating input signal; shifting a phase of the first signal and a phase of the second signal by a constant phase angle relative to each other; providing a number of first sub-signals on the basis of the first signal, and a number of second sub-signals on the basis of the second signal; adjusting respective amplitudes of the first and second sub-signals according to respective amplitude control signals of the plurality of control signals; combining a plurality, or all, of the first and second sub-signals in order to obtain the output signal. The adjustment of the amplitudes of the first and second sub-signals according to the respective amplitude control signals is performed such that a phase shift, relative to the alternating input signal, of a signal that can be obtained by a first combination of the first and second sub-signals equals a value within a predetermined phase sector of a plurality of phase sectors, which value is defined by the amplitude control signals. Combining the first and second sub-signals involves switching the first and second sub-signals in different ways according to respective switching control signals of the plurality of control signals so as to shift the defined value into a phase sector defined by the switching control signals.

BRIEF DESCRIPTION OF THE DRAWINGS

In the following, examples of the disclosure are described with reference to the accompanying figures, in which.

DETAILED DESCRIPTION OF ILLUSTRATIVE EMBODIMENTS

Examples of the present disclosure are presented in detail below using the accompanying descriptions. The following description specifies numerous details in order to provide a more thorough explanation of examples of the disclosure. It is obvious to a person skilled in the art, however, that other examples can implemented without these specific details. Features of the different examples described can be combined unless features of a particular combination are mutually exclusive or such a combination is ruled out explicitly.

It should be pointed out that identical or similar elements, or elements that have the same functionality, can have the same or similar reference signs or be given the same name, and that elements that have the same or similar reference signs or the same name are typically not described more than once. Descriptions of elements that have the same or similar reference signs or the same name are interchangeable. It should also be pointed out that an element having a reference sign comprising a number and a letter usually constitutes an example of an element which is referenced by the number. It is therefore intended that a description of the element that is referenced by the number also includes the element referenced by the number and a letter.

Irrespective of the diagram shown in the figures, the signal paths and circuits shown can be implemented by differential signal paths or single-ended signal paths, and also different parts of the circuits shown can be implemented in a variety of these ways.

Figure 1:
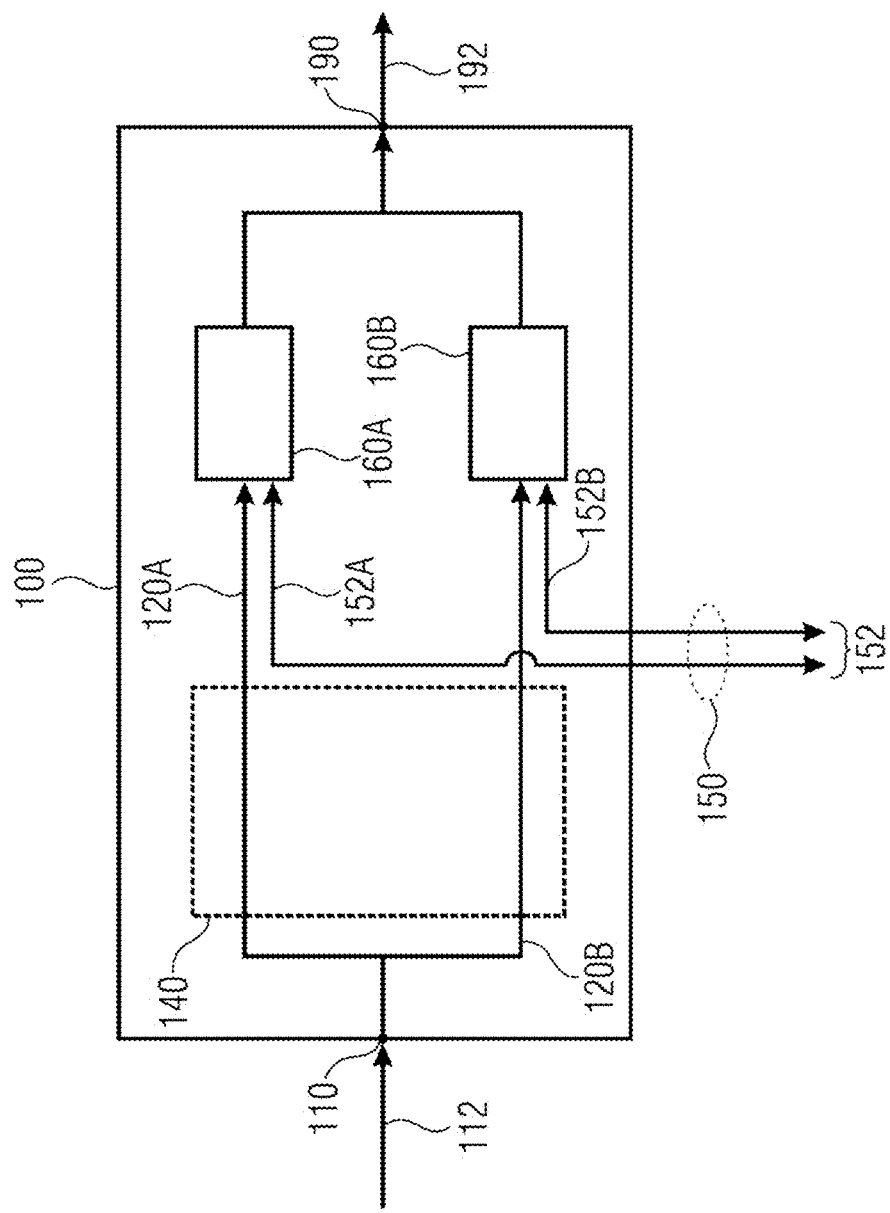
FIG. 1 shows a schematic diagram of an example of a phase shifter.

FIG. 1 shows a schematic diagram of an example of a phase shifter 100 for adjusting, on the basis of a plurality of control signals 150, a phase shift between an alternating input signal 112 present at an input 110 of the phase shifter and an output signal 192 of the phase shifter provided at an output 190 of the phase shifter. The phase shifter 100 comprises a first signal path 120A between the input 110 and the output 190, and a second signal path 120B between the input 110 and the output 190. The phase shifter 100 also comprises a phase-shifter circuit 140, which is designed to shift a phase of a first signal of the first signal path 120A and a phase of a second signal of the second signal path 120B by a constant phase angle relative to each other. The first and second signal paths 120A, 120B each comprise a voltage-divider circuit 160A, 160B respectively, which is connected in the respective signal paths 120A, 120B in order to adjust an amplitude of the signal of the respective signal paths 120A, 120B according to respective amplitude control signals 152A, 152B of the plurality of control signals 150. The phase shifter 100 is designed to provide the output signal 192 on the basis of a combination of the first and second signals 120A, 120B. The alternating input signal 112 is a periodic signal, for example a sinusoidal signal $RF_{in}$:

$$RF_{in}(t)=a_{in}\cos(wt) \quad (1)$$

As a result of the relative phase shift between the first signal and the second signal by the constant phase angle, it is possible to adjust the phase shift of the output signal 192 relative to the alternating input signal 112 by adjusting the amplitudes of the first signal and of the second signal. Thus, for example, it is possible to obtain from the signal $RF_{in}$, the output signal 192 in the form $RF_{out}$ including the phase shift Φ:

$$RF_{out}(t)=a_{out}\cos(wt+\Phi) \quad (2)$$

The diagram of the phase-shifter circuit 140 in FIG. 1 is intended as an example.

In examples, the phase-shifter circuit 140 is connected in the first signal path 120A or in the second signal path 120B in order to shift either the first signal or the second signal by the constant phase angle. In further examples, the phase-shifter circuit 140 is connected in the first signal path 120A and in the second signal path 120B in order to shift both the first and second signals so as to achieve a relative shift in the phases of the first and second signals by the constant phase angle.

In addition, the phase-shifter circuit 140 can be connected in the first and/or second signal path 120A, 120B either, as shown in FIG. 1, in front of the voltage-divider circuit 160A, 160B, or alternatively after the voltage-divider circuit 160A, B.

The phase-shifter circuit 140 is also referred to as a quadrature network in examples. The phase-shifter circuit 140 can be implemented in a manner compatible with low-voltage nanometer CMOS technology.

In examples, the constant phase angle equals±90°. This can be achieved, for example, by either the first signal or the second signal being shifted by ±90°, or one of the first and second signals being shifted by 45° and the other by −45°. In the case that the alternating input signal 112 has a sine or cosine waveform and a constant phase angle of ±90°, a temporal waveform of the first signal can be described by a cosine function, and a temporal waveform of the second signal by a sine function. If the constant phase angle equals±90°, a small change in a ratio of the amplitudes of the first and second signals can achieve a particularly large effect on the phase shift of the output signal. It is thereby possible to design the voltage dividers 160A, 160B to be smaller and/or to increase an energy efficiency of the phase shifter.

An adder, for example, can be used to combine the first and second signals 120A, 120B. In examples, the first signal 120A and the second signal 120B are added in the form of currents. Hence an amplitude of the output signal 192 can be adjusted independently of an amplitude of the alternating input signal 112.

The amplitude control signals 152A, 152B each contain information, on the basis of which the respective voltage-divider circuits 160A, 160B can adjust individually the respective amplitudes of the first signal 120A and of the second signal 120B. The phase shifter 100 can receive the plurality of control signals 150 as part of a signal stream, or receive each of the control signals individually, or receive a plurality of the control signals at a time as part of a common signal stream.

In examples, a division ratio of each of the voltage-divider circuits 160A, 160B can be digitally programmed, for instance by means of the respective amplitude control signals 152A, 152B. For example, the programming can be performed linearly (in a thermometer code), linearly or according to any other nonlinear function.

In examples, the phase shifter 100 is part of an integrated circuit. The integrated circuit can be implemented on a semiconductor chip.

Figure 2:
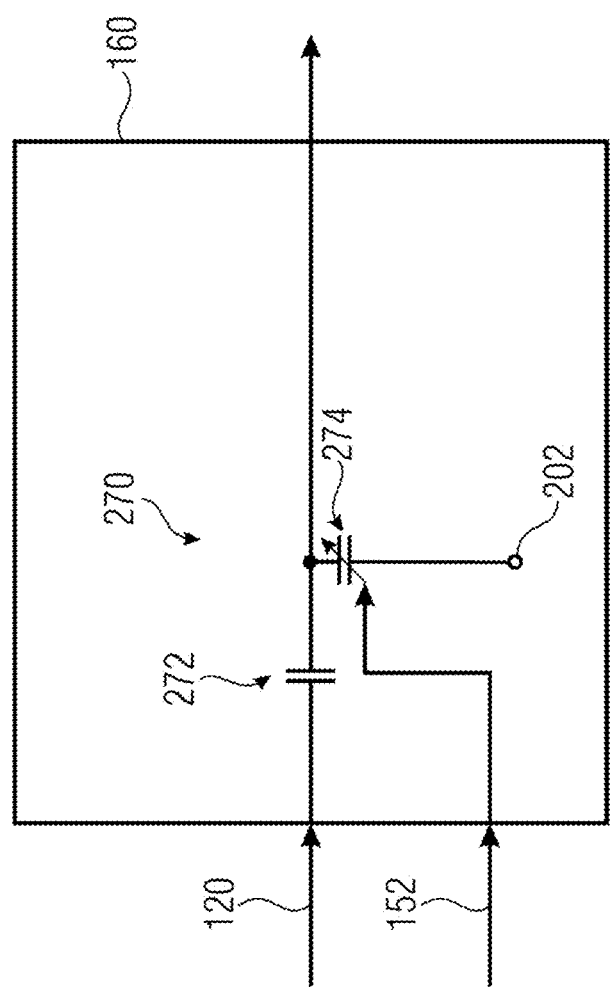
FIG. 2 shows a schematic diagram of an example of a voltage-divider circuit.

FIG. 2 shows a schematic diagram of an example of a voltage-divider circuit 160, which represents an example of the voltage-divider circuit 160A, 160B. The voltage-divider circuit 160 comprises a voltage divider 270, which comprises a first capacitance 272, which is connected in the signal path 120A, 120B. The voltage divider 270 also comprises an adjustable second capacitance 274, which is connected between the signal path 120A, 120B and a reference potential 202, in order to adjust an amplitude of the associated signal on the basis of a ratio between the first capacitance 272 and the second capacitance 274, which is also referred to as the division ratio of the voltage divider 270.

Using capacitances to implement the voltage divider 270 can prevent a current flow between the first or second signal path 120A, 120B respectively and the reference potential 202, whereby the phase shifter 100 is particularly low-noise and particularly energy-efficient. In addition, any aging effects are hence low. Moreover, by virtue of an implementation using capacitances, the adjustment of the amplitudes can be particularly insensitive to external conditions because the capacitances are determined largely by their geometry. For example, capacitances, unlike current-carrying elements, are insensitive to voltage fluctuations, for instance in the supply voltage.

In examples, the reference potential 202 is ground, making the voltage divider 270 particularly easy to implement.

The voltage divider 270 can be implemented with particularly low implementation costs in a semiconductor chip.

Figure 3:
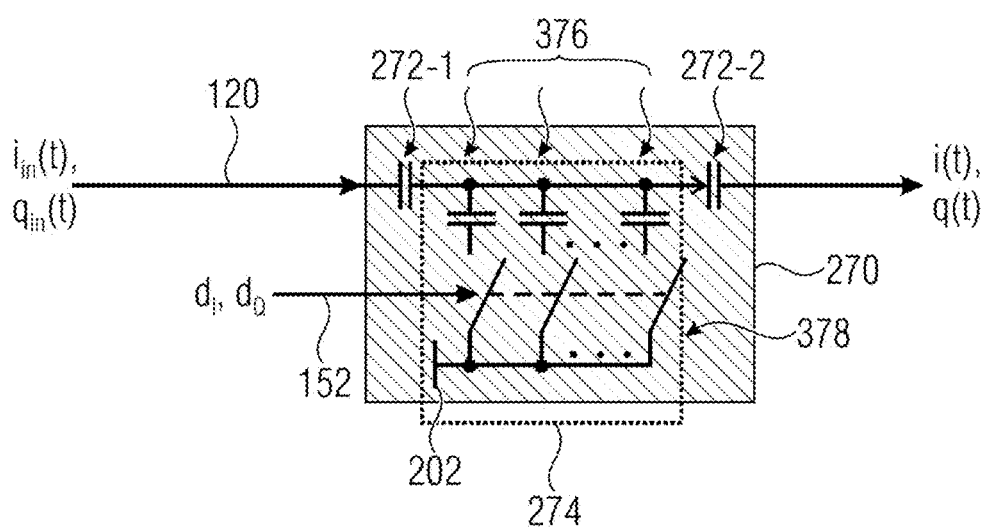
FIG. 3 shows a schematic diagram of an example of a voltage divider.

FIG. 3 shows a schematic diagram of an example of a voltage divider 270, in which the second capacitance 274 comprises a plurality of sub-capacitances 376, which can be connected selectively, in parallel with one another, between the signal path 120A, 120B and the reference potential 202. The amplitudes of the first and second signals 120A, 120B respectively can be adjusted particularly precisely by the plurality of sub-capacitances. For example, it is possible to achieve a required precision for the amplitude to be adjusted, and hence for the phase shift, by suitable selection of a quantity and a value of the sub-capacitances. In particular, the plurality of sub-capacitances can achieve a very high precision.

For example, each of the sub-capacitances 376 is connected via respective switching transistors 378 to the reference potential 202, so that, by switching the respective switching transistors 378, the respective sub-capacitances 376 can be switched in or out, with the result that the respective sub-capacitances 376 contribute, or do not contribute, to the second capacitance 274. The fact that the switching transistors 378 are operated as switches means that they contribute very little to the noise of the phase shifter 100 because normally there is no DC current flow, for instance to a sink of the transistor.

In examples, each of the switching transistors 378 is switched on the basis of one bit of the amplitude control signal 152. Thus the amplitude control signal for the voltage divider 270 can comprise an N-bit digital word (di, do) or digital signal, where N can equal the number of switching transistors 378.

As shown in FIG. 3, the first capacitance 272 can be subdivided into a plurality of capacitances 272-1, 272-2, which are located in each of the signal paths 120A, 120B, although this subdivision is optional and not dependent on the depicted implementation of the second capacitance 274, which can also be combined with the first capacitance 272 shown in FIG. 2.

As an alternative or in addition to the adjustable second capacitance 274, the voltage divider 270 can also be implemented using an adjustable first capacitance 272, in which a plurality of sub-capacitances of the first capacitance can be connected in parallel with one another in the signal path 120A, 120B. In this case, as shown for the second capacitance 274, a plurality of switching transistors can be used to implement the switching of the sub-capacitances of the first capacitance.

Figure 4:
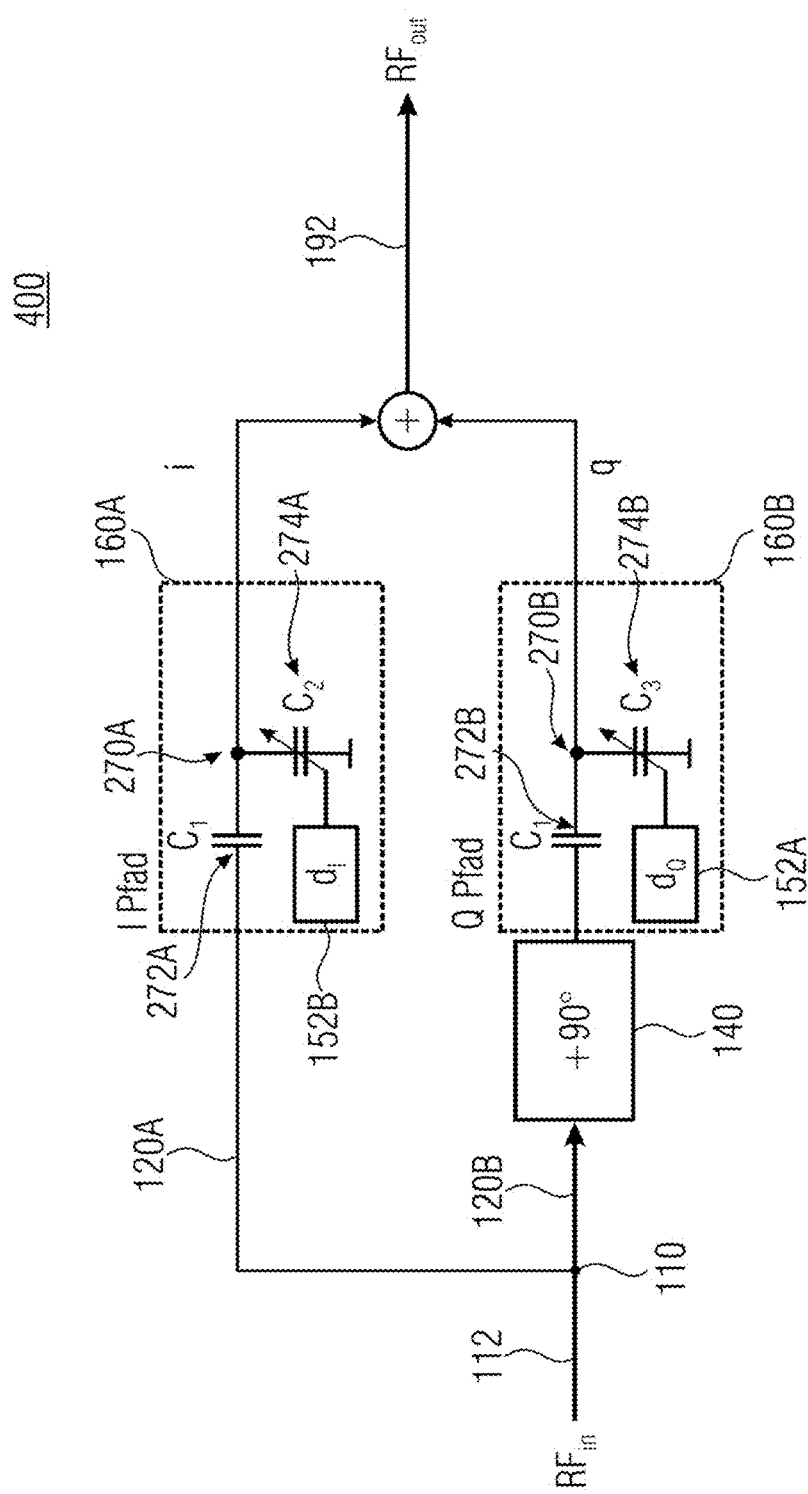
FIG. 4 shows an equivalent circuit of a further example of a phase shifter.

FIG. 4 shows an equivalent circuit of an example of a phase shifter 400, which can correspond to the phase shifter 100. The voltage dividers 270A, 270B of the phase shifter 400 are connected in the first signal path 120A and the second signal path 120B respectively. For example, the adjustable values of the second capacitances 274A and 274B of the voltage dividers 270A and 270B equal $C_2$ and $C_3$ respectively. The first capacitances 272A, 272B of the voltage dividers 270A, 270B have the value $C_1$, for example. In the example shown in FIG. 4, the phase-shifter circuit 140 is connected in the second signal path 120B in order to retard the second signal by 90°. For the implementation shown, the phase shift Φ of the output signal 192 can be calculated as follows:

$$\Phi = \arctan(C_2+C_1)/(C_3+C_1)$$

Figure 5:
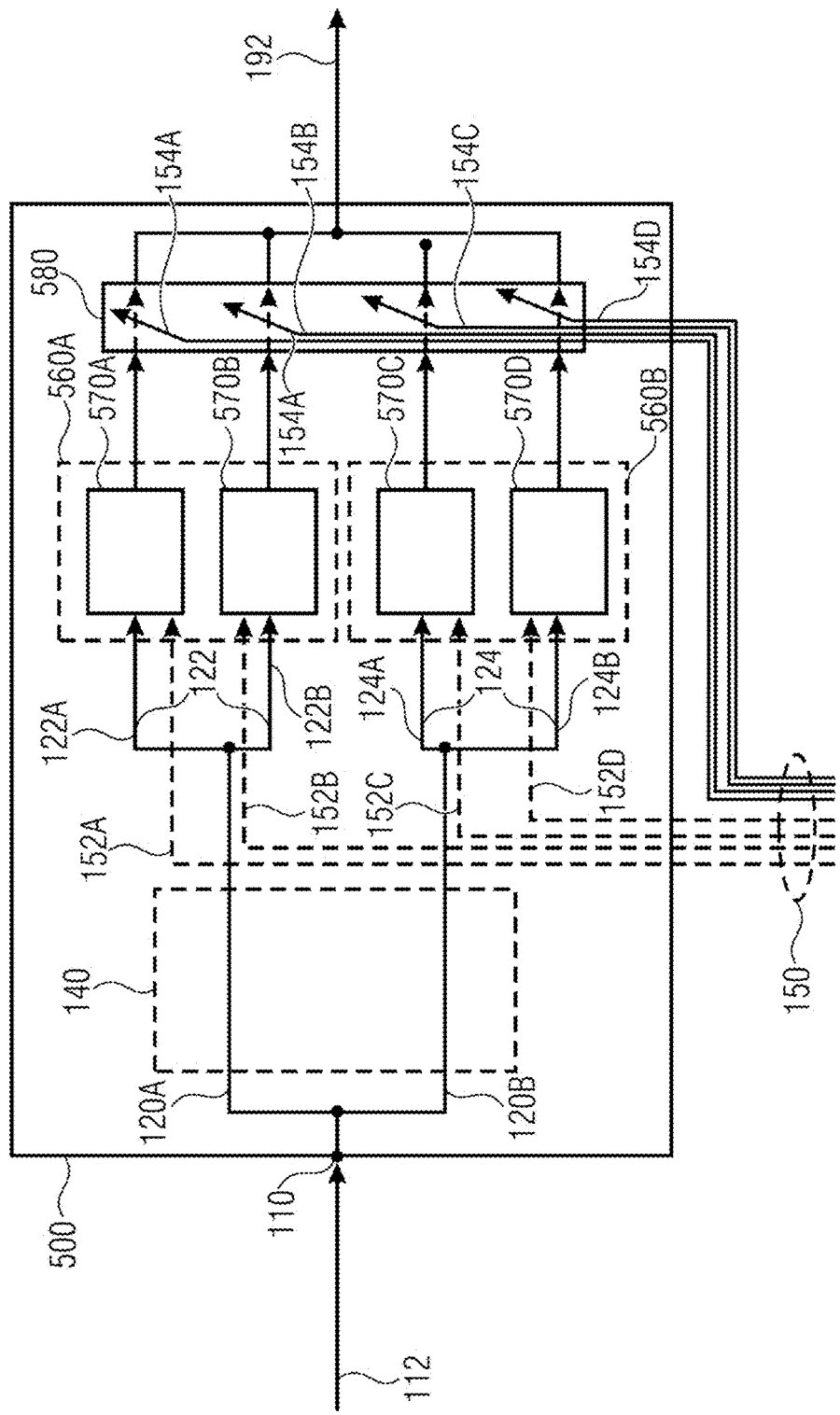
FIG. 5 shows a schematic diagram of a further example of a phase shifter.

FIG. 5 shows a schematic diagram of an example of a phase shifter 500. For some elements of the phase shifter 500, reference is made to the description of the phase shifter 100, 400 relating to FIG. 1 to FIG. 4. The phase shifter 500 for adjusting, on the basis of the plurality of control signals 150, a phase shift between the alternating input signal 112 present at the input 110 of the phase shifter and the output signal 192 of the phase shifter provided at the output 190 of the phase shifter, comprises the first signal path 120A, the second signal path 120B and the phase-shifter circuit 140.

The first signal path 120A comprises a number of parallel-connected first sub-signal paths 122, for instance two first sub-signal paths 122A, 122B as shown in FIG. 5, for respective first sub-signals, which first sub-signals are based on the first signal. The second signal path 120B comprises a number of parallel-connected second sub-signal paths 124, for instance two second sub-signal paths 124A, 124B as shown in FIG. 5, for respective second sub-signals, which second sub-signals are based on the second signal. For example, a phase of each of the first sub-signals of the first sub-signal paths 122 equals, or is similar to, the phase of the first signal of the first signal path 120A, and a phase of each of the second sub-signals of the second sub-signal paths 124 equals, or is similar to, the phase of the second signal of the second signal path 120B.

The first and second sub-signal paths 122, 124 each comprise an amplitude adjustment unit 570, wherein the respective amplitude adjustment units 570A-D are connected in the respective sub-signal paths 122A, 122B, 124A, 124B in order to adjust an amplitude of the respective sub-signals according to respective amplitude control signals 152A D of the plurality of control signals 150.

The amplitude adjustment units 570A, 570B of the first sub-signal paths 122 can optionally be referred to as an amplitude adjustment circuit 560A of the first signal path 120A, and the amplitude adjustment units 570C, 570D of the second sub-signal paths 124 can optionally be referred to as an amplitude adjustment circuit 560B of the second signal path 120B.

In examples, the amplitude adjustment units 570A D are each implemented by means of the voltage divider 270 such that the first capacitance 272 of the voltage divider 270 is connected in the respective sub-signal paths 122A, 122B, 124A, 124B, and the second capacitance 274 is connected between the respective sub-signal paths 122A, 122B, 124A, 124B and the reference potential 202, in order to adjust the amplitudes of the respective sub-signals on the basis of the ratio between the first capacitance 272 and the second capacitance 274. In this example, the amplitude adjustment circuits 560A, 560B can correspond to the voltage-divider circuits 160A, 160B, and the phase shifter 500 can correspond to the phase shifter 100.

The output signal 192 from the phase shifter 500 is based on a combination of a plurality, or all, of the first and second sub-signals. For example, the merging of the first and second sub-signals into the output signal 192 can be performed as described with reference to combining the first signal 120A and the second signal 120B.

The phase shifter comprises a combiner circuit 580, which is designed to switch the first and second sub-signals 122, 124 in different ways according to respective switching control signals 154A D of the plurality of control signals 150 in order to adjust the combination of the first and second sub-signals. For example, the combiner circuit 580 can open or close the first and second sub-signal paths 122,124 so that the respective sub-signals contribute selectively to the output signal 192 according to the switching by the combiner circuit.

Switching the first and second sub-signals in different ways can also include switching one of the sub-signals such that a phase of the sub-signal is shifted by a half period, and the sub-signal contributes to the output signal 192.

The arrangement of the combiner circuit 580 in the first and second signal paths 120A, 120B that is shown in FIG. 5 is intended by way of example. For example, the combiner circuit 580 can also be arranged in front of the amplitude adjustment units 570.

Figure 6:
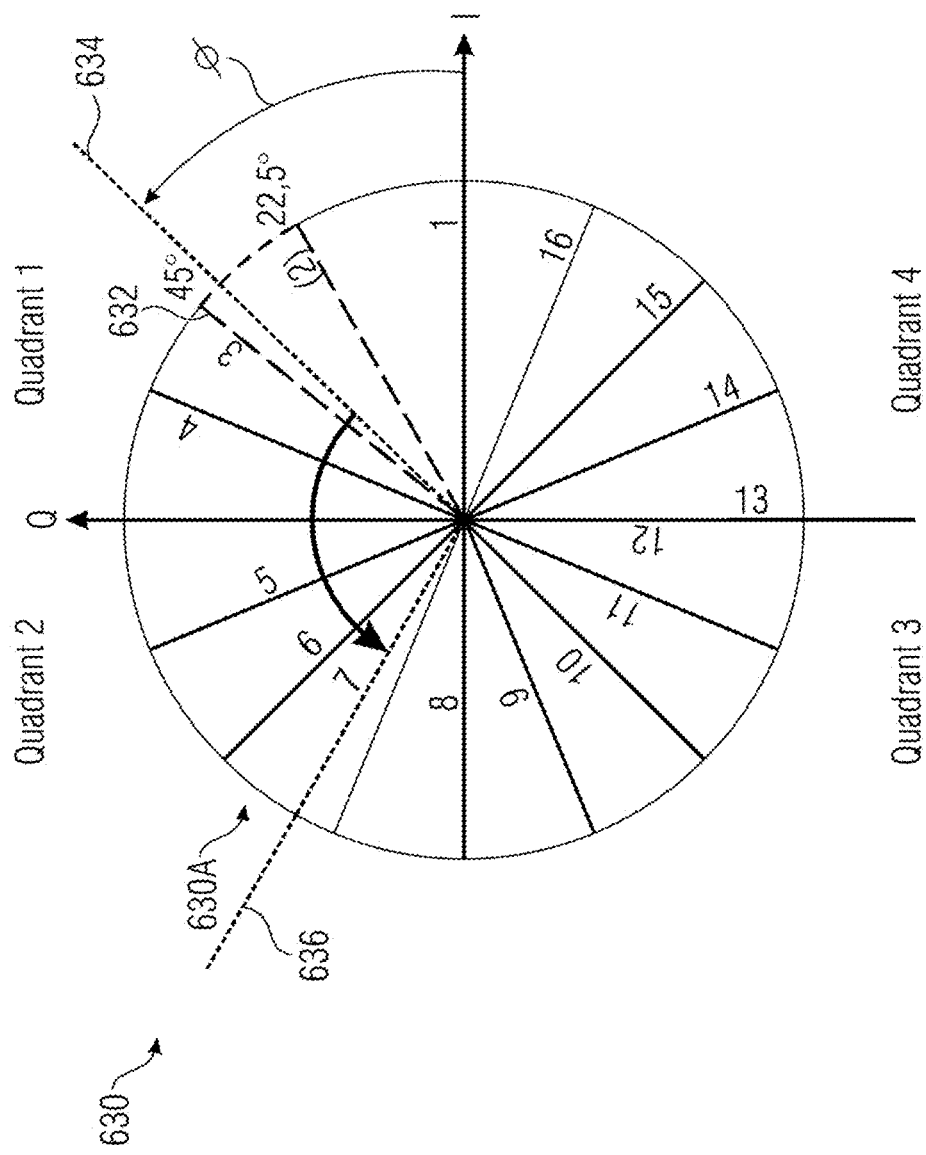
FIG. 6 shows an example of dividing an I/Q diagram into sectors.

FIG. 6 shows an example of dividing an I/Q diagram into sectors. The I/Q diagram comprises a plurality of phase sectors 630, in this example 16 phase sectors 116. Each of the phase sectors 116 contains an interval of a value range for the phase shift Φ of the output signal 192. The phase sectors can contain contiguous intervals of the value range that are each of equal size. The value range for the phase shift Φ contained by the plurality of phase sectors 630 can equal, for example, an entire period of the alternating input signal 112. In some examples, however, the value range can be chosen to be smaller, for instance if only phase shifts in a small value range are required. A value of the phase shift can be referred to as a phase angle, and an entire period of the alternating input signal 112 can be represented by a value range of 0° to 360°.

The amplitude adjustment units 570 shown in FIG. 5 in the first and second sub-signal paths 122, 124 are designed to adjust the amplitudes of the first and second sub-signals according to the amplitude control signals 152 such that a phase shift, relative to the alternating input signal 112, of a signal that can be obtained by a first combination of the first and second sub-signals equals a value 634 within a predetermined phase sector 632 of the plurality of phase sectors 630, which value is defined by the amplitude control signals 152 (cf. FIG. 6). In addition, the combiner circuit 580 is designed to switch the first and second sub-signals so as to shift the defined value 634 into a phase sector 630A defined by the switching control signals 154, in order to adjust the phase shift of the output signal 192 to a value 636 signaled by the plurality of control signals 150.

In examples, the phase sectors 630 are each smaller than a quarter of an entire period. For example, the phase sectors 630 are each an eighth or a twelfth or, as shown in FIG. 6, 1/16 or 1/24 of an entire period.

For example, the number of sub-signal paths 122, 124 of the first and second signal paths 120A, 120B can depend on the size and/or the number of the phase sectors 630. For example, for a large number of phase sectors 630, a large number of sub-signal paths 122, 124 may be required in order to facilitate a shift of the defined value 632 into the defined phase sector 630A of the phase sectors 630 by switching the first and second sub-signals.

In examples, the amplitude adjustment units 570, for instance the voltage dividers 270, in the first and second sub-signal paths 122, 124 are designed to be able to adjust the amplitudes of the first and second sub-signals such that a phase shift, relative to the alternating input signal 112, of a signal that can be obtained by a first combination of the first and second sub-signals can be adjusted solely to values within a predetermined phase sector 632 of a plurality of phase sectors 630. This means that it can be sufficient to be able to adjust the amplitudes of the first and second sub-signals solely to values within a small amplitude range. Thus said design of the amplitude adjustment units 570 allows a more economical implementation of the amplitude adjustment units 570 in terms of space and/or energy. For example, the voltage dividers 270, in particular the second capacitances 274, can be designed to be smaller, which means, for instance, that space on a semiconductor chip can be saved.

In examples in which the value range of the phase shift equals 0° to 360°, shifting the defined value into each of the phase sectors 630 is facilitated in examples by the phase sectors 630 each equaling an n'th of a quarter period, and the number of first sub-signal paths 122 and the number of second sub-signal paths 124 being equal to n/2 in each case. For example, the phase sectors 630 each have an interval width of 22.5°, and the number of first subsignal paths and second subsignal paths 122,124 is equal to two in each case. This example can constitute a good compromise between the number of sub-signal paths required and a size or implementation cost of the amplitude adjustment units 570, 270.

Figure 7:
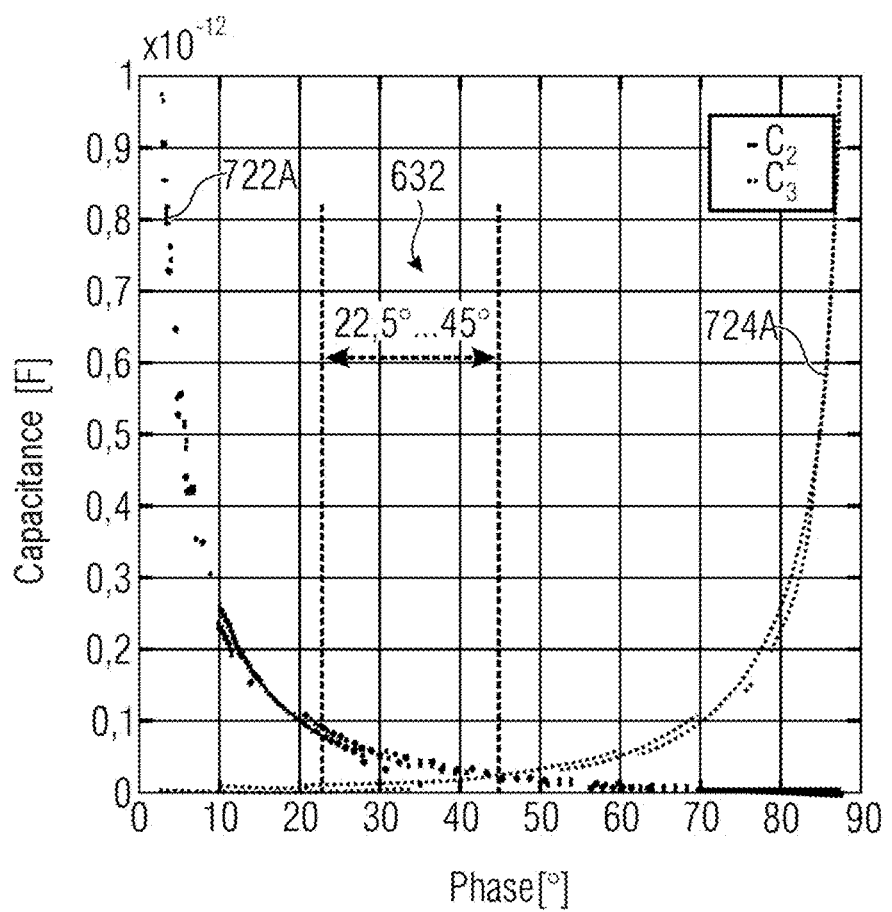
FIG. 7 shows a graph of an example of values of the second capacitances.

FIG. 7 shows a graph of an example of values 722A, 724A that may be required for the second capacitances 274 in the first sub-signal path 122A and in the second sub-signal path 124A in order to achieve, by adding the first sub-signal of the first sub-signal path 122A and the second sub-signal of the second sub-signal path 124A, a phase shift, which is plotted on the abscissa of the graph. FIG. 7 also shows a possible choice of the predetermined phase sector 632 in the interval from 22.5° to 45°. This choice allows the second capacitances 274 to be particularly small.

It is also evident from FIG. 7 that there are potential difficulties in achieving a phase shift or phase angle close to 0° and 90° using capacitances of limited or realistic size. By selecting the number of first and second sub-signal paths 122, 124 to be greater than 1 in each case, it is possible to avoid having to reach these limit angles, for instance even if a phase shift of 0° or 90° is meant to be set.

In other words, for the phase shifter 400 shown in FIG. 4, in which the first signal path 120A and the second signal path 120B each comprise just one sub-signal path, it may be necessary for the second capacitances 274 to be very large in order to suppress the respective signals for phase angles close to integer multiples n=0, 1, 2, . . . of 90°. For example, the second signal, or the Q path, must be zero or close to zero in order to set a phase shift of 0°. This means that the second capacitance 274B must be very large, which can equate to a large surface area on a semiconductor chip, for instance a silicon chip.

If the amplitude adjustment units 570 are implemented as voltage dividers 270, for instance in examples of the phase shifter 100, 400, a value of the largest sub-capacitance 376 of the second capacitance 274 may limit an adjustment resolution for the defined value 634 or the phase shift 636. It can therefore be advantageous to choose the size of the phase sectors to be smaller than 90° or as small as possible. A better resolution can hence be achieved for a given number of sub-capacitances 376 and/or for a given maximum value of the sub-capacitances 376.

In examples, the adjustment of the amplitudes of the first and second signals 120A, 120B or of the first and second sub-signals 122, 124 can also take into account that an amplitude of the output signal (e.g., $a_{out}$ in equation (2)) remains at least approximately constant with respect to a change in the phase shift. In other words, a digital adjustment of the amplitudes can be selected such that the resultant constellation points, for instance points in a circle diagram in which the amplitude of the output signal is plotted against the phase angle of the phase shift, lie on a circle. In examples, this can be represented as $a_{out}(t)_2=i(t)_2+q(t)_2$, if i and q stand for the time-dependent amplitudes in the first and second signal paths respectively. In examples, the adjustment of the amplitudes by means of the amplitude adjustment units 570 or the voltage dividers 270 takes into account the condition that the amplitude of the output signal 192 is meant to be approximately constant. In examples, this condition is ensured alternatively or additionally by additionally adapting the amplitude of the sub-signals by means of the combiner circuit 580 (for instance by means of the switches 882 of the combiner circuit 580 or of the converters 986; cf. FIG. 8, FIG. 9).

Table 1 shows with reference to FIG. 6 an example of possible combinations of the first and second sub-signals that allow the defined value 634 to be shifted from the predetermined phase sector 632 into the respective phase sectors of the plurality of phase sectors 630 in order to obtain a desired phase shift 636 ($\Phi'$). The example is based on an alternating input signal 112 having a cosine waveform, as presented in equation 1, in order to obtain the output signal 192, which has been shifted by the phase shift $\Phi'$, for instance as presented in equation 2 (denoted there by phase shift $\Phi$). This is a particularly clear representation, but the disclosed principle can also be applied to other signal representations. The combinations shown in Table 1 can allow phase angles of the phase shift to be adjusted within an entire period of 0° to 360°. The resolution at which the phase shift can be adjusted can depend here on the resolution at which the amplitude adjustment units 570 allow the adjustment of the defined value 634. In Tab. 1, the terms q cos wt+i·cos wt represent signals in two first sub-signal paths 122A, 122B, and the terms q sin wt, i sin wt represent signals of two second sub-signal paths 124A, 124B, wherein the amplitudes i and q are defined, for example, as follows, where $\Phi$ in this case denotes the defined value 634 in the predetermined phase sector:

$$i:=\cos \Phi \quad q:=\sin \Phi$$

The amplitudes i and q can each be adjusted by means of the amplitude adjustment units 570. Negative terms can be achieved, for instance, by adding a corresponding signal shifted by a half-period.

TABLE 1

| Phase-sector index (sector) | Interval of the phase angle of the phase shift [°] | Combination of the first and second sub-signals for the output signal e.g. $RF_{out}$ |
|---|---|---|
| 1 | 0 ≤ $\Phi'$ < 22.5 | $\sqrt{2}/2 \cdot$ (q · sin wt − i · sin wt + q · cos wt + i · cos wt) |
| 2 | 22.5 ≤ $\Phi'$ < 45.0 | i · cos wt − q · sin wt |
| 3 | 45.0 ≤ $\Phi'$ < 67.5 | q · cos wt − i · sin wt |
| 4 | 67.5 ≤ $\Phi'$ < 90.0 | $\sqrt{2}/2 \cdot$ (−q · sin wt − i · sin wt − q · cos wt + i · cos |
| 5 | 90.0 ≤ $\Phi'$ < 112.5 | $\sqrt{2}/2 \cdot$ (−q · sin wt − i · sin wt + q · cos wt − i · cos |
| 6 | 112.5 ≤ $\Phi'$ < 135 | −i · sin wt − q · cos wt |
| 7 | 135 ≤ $\Phi'$ < 157.5 | −q · sin wt − i · cos wt |
| 8 | 157.5 ≤ $\Phi'$ < 180 | $\sqrt{2}/2 \cdot$ (q · sin wt − i · sin wt − q · cos wt − i · cos wt) |
| 9 | 180 ≤ $\Phi'$ < 202.5 | $\sqrt{2}/2 \cdot$ (−q · sin wt + i · sin wt − q · cos wt − i · cos |
| 10 | 202.5 ≤ $\Phi'$ < 225 | −i · cos wt + q · sin wt |
| 11 | 225 ≤ $\Phi'$ < 247.5 | −q · cos wt + i · sin wt |
| 12 | 247.5 ≤ $\Phi'$ < 270 | $\sqrt{2}/2 \cdot$ (q · sin wt + i · sin wt + q · cos wt − i · cos wt) |
| 13 | 270 ≤ $\Phi'$ < 292.5 | $\sqrt{2}/2 \cdot$ (q · sin wt + i · sin wt − q · cos wt + i · cos wt) |
| 14 | 292.5 ≤ $\Phi'$ < 315 | i · sin wt + q · cos wt |
| 15 | 315 ≤ $\Phi'$ < 337.5 | q · sin wt + i · cos wt |
| 16 | 337.5 ≤ $\Phi'$ < 360 | $\sqrt{2}/2 \cdot$ (−q · sin wt + i · sin wt + q · cos wt + i · cos |

Figure 8:
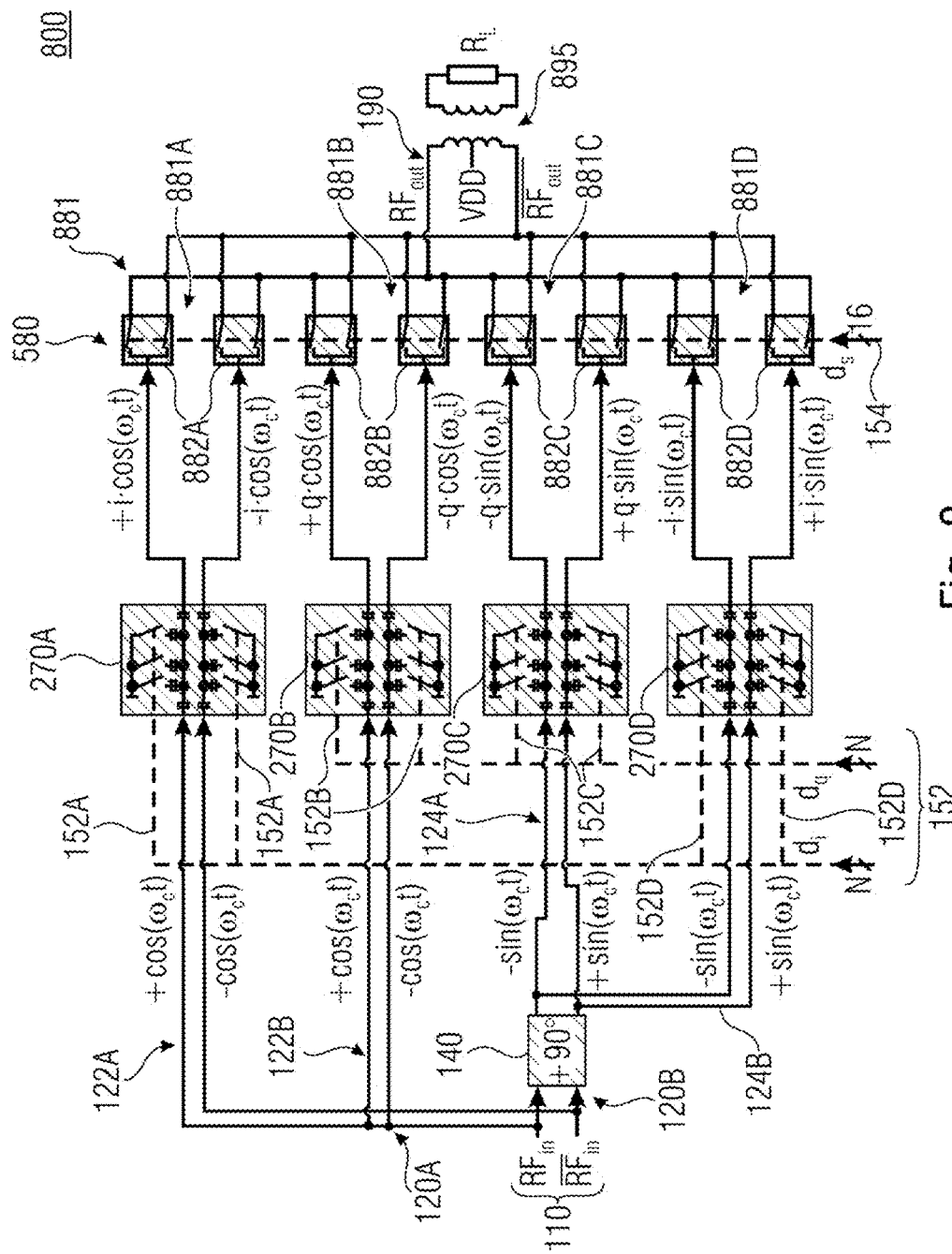
FIG. 8 shows a schematic diagram of a further example of a phase shifter.
Figure 9:
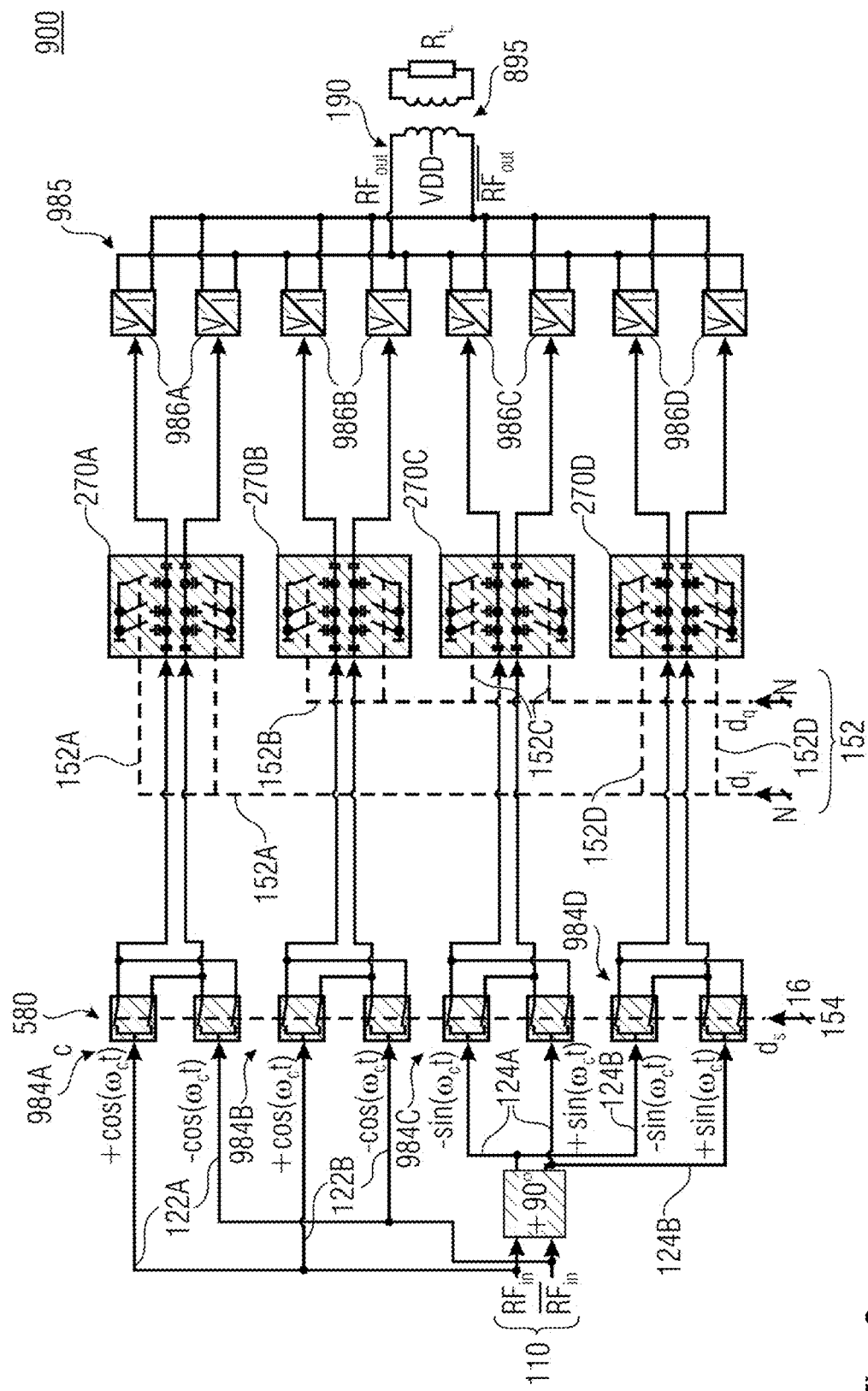
FIG. 9 shows a schematic diagram of a further example of a phase shifter.
Figure 10:
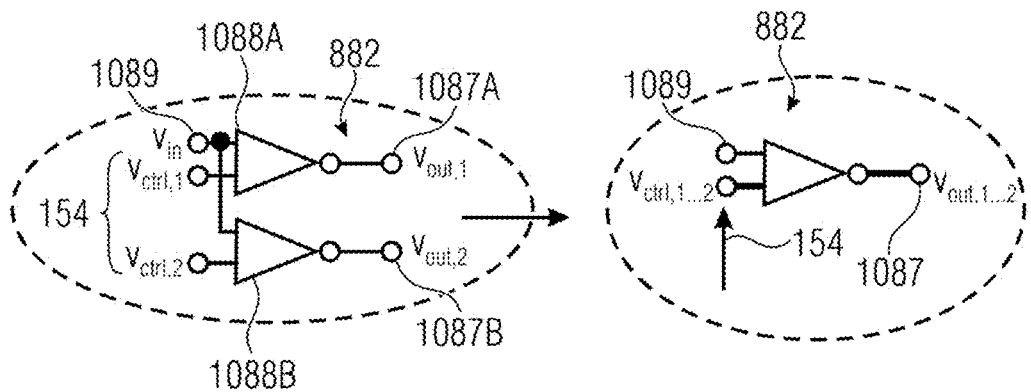
FIG. 10 shows a schematic diagram of an example of a switch.

The scaling of the output signals or sub-signals by the scaling factor $\sqrt{2}/2$, as in this example for the phase sectors 1, 4, 5, 8, 9, 12, 13, 16, can be performed by the amplitude adjustment units or voltage dividers or by gain control in switches 882, 1088 of the combiner circuit, for example before the summation of the sub-signals (cf. FIGS. 8, 9, 10).

As described above, sizes of the phase sectors 630 other than those shown in FIG. 6 are possible (for example) 30°, where larger phase sectors can involve larger capacitances, and smaller phase sectors can increase the number of cases that need to be distinguished, which for instance can increase the length of Tab. 1 and can lead to a larger number of different scaling factors. This is why a size of 22.5° for the phase sectors represents a good compromise.

The combinations shown in Tab. 1 for achieving the phase sectors 630 can be determined as described below. Combinations can also be determined for a different division of the phase sectors on the basis of the same principle. Starting from a desired phase shift by the phase angle d' in the value range [0°, 360°], it is possible to determine the core sector angle $\Phi$ in the range [22.5°, 45°], i.e. the defined value 634 within the predetermined phase sector 632, which value is to be adjusted, and the required combination of the output signals from the four differential attenuators, i.e. the sub-signals of the voltage dividers in differential form, as follows. Only the positive components of the differential elements of the output signal 192, $RF_{out}$, are considered here; the inverse $RF_{out}$ is obtained by multiplying the expression for $RF_{out}$ by −. The RF output signal from the phase shifter can hence be represented as follows, where the amplitude $a_{out}$ from equation (2) is omitted for clarity.

$$RF_{out}(t)=\cos(wt+\Phi) \quad (5).$$

This can be reduced to the first quadrant $$RF_{out}(t)=\cos(wt+\Phi11+k2.) \quad (6)$$

where k∈{1, 2, 3, 4} is the quadrant index given by $$k=[\Phi1/190°]+1 \quad (7).$$

In this equation, [ . . . ] means conversion to an integer by removing the decimal places. The angle $\Phi11$ lies in the range [0°, 90°], where $$\Phi11=\Phi1−(k−1)·90° \quad (8).$$

The sector m∈{1, 2, 3, 4} inside the first quadrant is:

$$m=[\Phi1/22.5°]+1 \quad (9).$$

The total sector index mtot within the circle (cf. FIG. 6 and first column of Tab. 1) is:

$$m_{tot}=4·(k−1)+m \quad (10)$$

The transformation between the angle $\Phi_{11}$ in the quadrant and the core sector angle $\Phi$ is given by:

$$\Phi = \begin{matrix} 45° - \Phi_{11} & \text{for sector index } m = 1 \\ \Phi_{11} & \text{for sector index } m = 2 \\ 90° - \Phi_{11} & \text{for sector index } m = 3 \\ \Phi_{11} - 45° & \text{for sector index } m = 4 \end{matrix} \quad (11)$$

Solving equation (11) for $\Phi_{11}$ and substituting, together with the equations (7,8), inequation (6) yields, after several trigonometric transformations, the expressions of Tab. 1.

In examples, the first and second sub-signal paths each comprise a sub-signal phase switch, wherein the respective sub-signal phase switches are designed to shift a phase of the respective sub-signals selectively by a half period according to respective phase-control signals of the plurality of control signals.

In advantageous examples, the respective sub-signal phase switches can be combined by the combiner circuit 580; for instance the combiner circuit 580 can be designed both to adjust the combination of the first and second sub-signals and optionally to shift a phase of one or more of the first and second sub-signals by a half period, in each case by switching the first and second sub-signals.

In examples, the first and second sub-signal paths 122, 124 are differential signal paths, wherein the sub-signal phase switch of the respective sub-signal paths is designed to invert the associated sub-signal according to the associated switching control signal or phase-control signal in order to shift the phase of the associated sub-signal selectively by a half period. The use of differential signals means that inverting one or more of the first and second sub-signals, i.e. subtracting one or more of the first and second sub-signals, can be implemented particularly easily.

FIG. 8 and FIG. 9 show examples of how it is possible to implement the example shown in connection with Tab. 1 of dividing into phase sectors 630 and shifting the defined value 634. In general, this can be achieved by a circuit that is capable of distributing the four first and second sub-signals specified in Tab. 1 and their inverse signals, so for instance the differential components of the first and second sub-signals, to two differential nodes of the output 190, for example in every possible combination, and of summing the respective signals at the node. When one of the signals of the amplitude adjustment units 570 is not required for a given combination, for instance the term i sin wt for the phase sector of index two in Tab. 1, then this signal can be isolated from the summation.

FIG. 8 shows a schematic diagram of an example of a phase shifter 800. The phase shifter 800 can correspond to the phase shifter 100 or the phase shifter 500. The input signal 112, denoted by $RF_{in}$, the output signal 192, denoted by $RF_{out}$, and the first and second sub-signals, in particular output signals from the amplitude adjustment units 570, of the phase shifter 800, are differential signals, where the overbar x indicates an inversion of the base signal x, i.e. $\overline{x}=-x$.

The combiner circuit 580 is connected in the phase shifter 800 in the first and second sub-signal paths 122, 124 after the voltage divider 270. The combiner circuit 580 comprises a plurality of sub-signal phase switches 881 comprising sub-signal phase switches 881A-D, each of which is connected in one of the first or second sub-signal paths 122A, 122B, 124A, 124B in order to shift selectively a phase of the respective sub-signals by a half period according to respective switching control signals, which are optionally part of a control signal 154, and in order to switch a contribution of the respective sub-signals to the output signal 190, for instance such that, according to the switching by the combiner circuit 580, the respective sub-signals contribute to the output signal or do not contribute to the output signal, and wherein a phase of the respective sub-signals either is shifted by a half period or is not shifted.

The sub-signal phase switches 881 each comprise a pair of switches 882A-D, which can also be referred to as splitters. One pair of switches 882A D is connected in each of the first and second sub-signal paths 122A, 122B, 124A, 124B in order to connect the respective sub-signals to the output 190, or disconnect said sub-signals therefrom, on the basis of respective switching control signals 154, for the purpose of adjusting the combination of the first and second sub-signals. For each pair, one of the two switches 882A-D is connected in the associated sub-signal path so as to switch the base signal of the associated sub-signal, and one of the two switches 882A-D is connected in the associated sub-signal path so as to switch the inverse of the associated sub-signal.

The switches 882A-D of the phase shifter 800 each provide the respective sub-signals at respective outputs of the switches 882A-D such that the output signal 192 can be obtained by shorting the outputs of the switches 882A-D.

For example, the pairs of switches 882A-D of each of the sub-signal phase switches 881A-D can be switched such that either the base signal of the associated sub-signal is connected to one of the differential paths of the output 190, and the inverse of the associated sub-signal is connected to the other path of the differential paths of the output 190, or vice versa, or such that both switches 882A-D of the respective sub-signal phase switches 881A-D are open. Hence either the associated sub-signal, or the inverse thereof, i.e. the sub-signal shifted by a half-period therefrom, is switched to the output, or the sub-signal is not switched to the output.

The respective switching control signals for the sub-signal phase switches 881 can be provided individually for each of the sub-signal paths, or, as shown in FIG. 8, can be part of one switching control signal 154. For example, the switching control signal 154 can contain a digital word or digital signal as that comprises two bits for switching one each of the switches 882A-D. Thus the switching control signal can comprise 16 bits, for example. In alternative examples, a 2-bit signal is used to switch each pair of switches 882A-D.

In other words, the voltage dividers 270 of the phase shifter 800 are connected to the switches 882A-D. The switches 882A-D can be implemented as inverters, for instance as self-biased inverters. An input impedance of the switches 882A-D, for instance viewed from the respective voltage dividers 270, may be a capacitance, and therefore constitutes a capacitive element in the respective second capacitances 274 of the respective voltage dividers 270. This can be taken into account in the design of the voltage dividers 270.

FIG. 8 also shows an optional example of a secondary circuit 895 for the phase shifter 800. The secondary circuit 895 can be omitted or replaced by a different follower circuit.

FIG. 9 shows a schematic diagram of an example of a phase shifter 900. The phase shifter 900 can correspond to the phase shifter 100 or the phase shifter 500. As described with regard to the phase shifter 800, the alternating input signal 112, the output signal 192 and the first and second sub-signals are implemented differentially. As in FIG. 8, the secondary circuit 895 can be considered to be optional.

In the phase shifter 900, the combiner circuit 580 is connected in front of the voltage dividers 270. The combiner circuit 580 of the phase shifter 900 contains a plurality of sub-signal phase switches 984A-D, which sub-signal phase switches 984A-D are connected respectively in one of the first or second sub-signal paths 122A, 122B, 124A, 124B in order to shift selectively a phase of the respective sub-signals by a half period according to respective switching control signals, which may be part of the switching control signal 154, for example, and in order to switch a contribution of the respective sub-signals to the output signal 190. The sub-signal phase switches 984A-D can be connected respectively in one of the first or second sub-signal paths 122,124 in order either to connect the respective sub-signals to the output 190 or to disconnect said sub-signals therefrom on the basis of respective switching control signals, or to invert the respective sub-signals in order to shift the phase of the respective sub-signals by a half period and provide at the output 190 the respective sub-signals shifted in phase by a half-period.

The switching control signal 154 used for the phase shifter 900 can be implemented as described with reference to the phase shifter 800.

The plurality of control signals 150 can therefore contain a plurality of amplitude control signals 152 and a plurality of switching control signals 154, either in an individual signal stream or in a plurality of signal streams. For example, the amplitude control signals 152 and the switching control signals 154 can be combined in one signal stream each.

The sub-signal phase switches 984 can each comprise a pair of the switches 882A D. For each pair, one of the switches 882A-D is connected in the associated sub-signal path so as to switch the base signal of the associated sub-signal, and one of the switches 882A-D is connected in the associated sub-signal path so as to switch the inverse of the associated sub-signal. The switching can be performed in a manner similar to that explained with reference to FIG. 8.

The phase shifter 900 also contains a plurality of voltage-to-current converters 986, where one pair of voltage-to-current converters 986A-D is connected in each of the first or second sub-signal paths 122A,B, 124A,B in order to receive the respective sub-signals from the voltage dividers 270A-D and to provide the respective sub-signals as a current at respective outputs of the voltage-to-current converters 986. The output signal 192 can thereby be obtained at the output 190 by shorting the first and second sub-signal paths. The voltage-to-current converters 986 can be implemented as self-biased inverters, for example. These may require a DC supply voltage.

Figure 11:
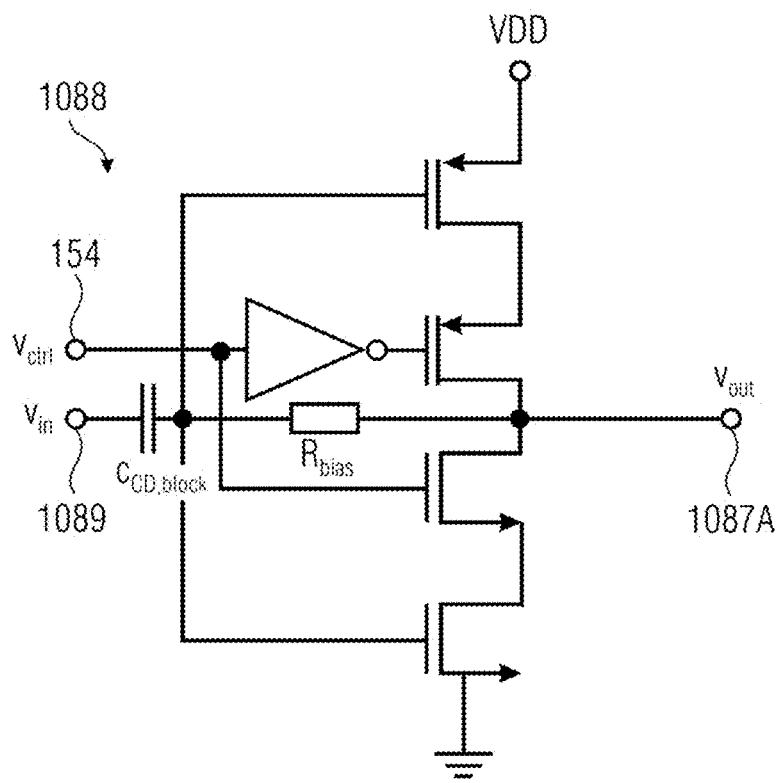
FIG. 11 shows a circuit diagram of an example of a tristate buffer.

FIG. 10 shows a schematic diagram of an example of a switch 882, which can be an example of the switch 882A-D. The switch 882 receives as a switch input signal 1089 one of the first or second sub-signals, or a base signal or an inverse signal of one of the first or second sub-signals. The switch 882 also receives the respective switching control signals 154, which can be referred to also as phase-sector control signals, for example. As shown in FIG. 10, the switch 882 can be implemented by two tristate buffers 1088A,B, which each receive the switch input signal 1089 and an associated switching control signal 154. Each of the tristate buffers 1088A,B can provide, according to the switching control signal 154, a buffer output signal 1087A,B, which is based on the switch input signal 1089, for instance at respective buffer outputs. The buffer output signal 1087 can be fed, for example, to the output 190 (phase shifter 800) or to an input of one of the voltage dividers 270 (phase shifter 900). FIG. 11 shows a circuit diagram of an example of a tristate buffer 1088, for instance the tristate buffer 1088A,B. For example, the switching control signal 154 for the switch 882 can contain 1 bit for each of the tristate buffers 1088A,B. Thus the plurality of control signals for the phase shifter 800, 900 can contain a total of 16 bits for the switching control signals 154.

The switch 882 can be implemented with particularly low implementation costs in a semiconductor chip.

In other words, referring to the phase shifter 800, the voltage dividers 270 can be charged by the switches 882. The switches 882 can each be implemented by two tristate buffers 1088, for example, as shown in FIG. 10.

Figure 12:
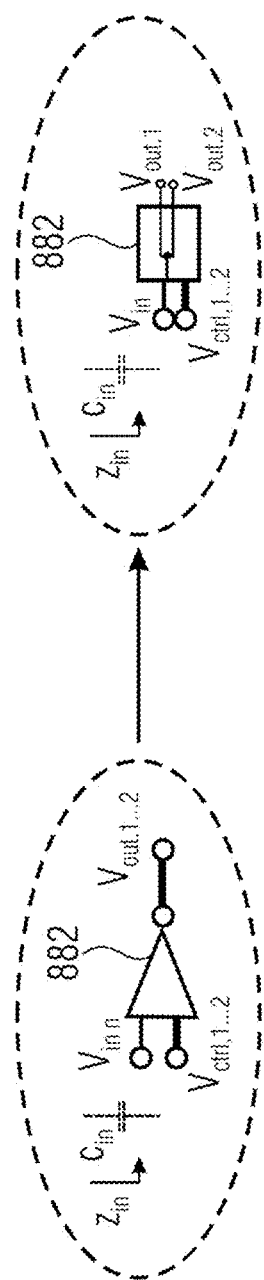
FIG. 12 shows an Illustration of an intrinsic impedance of a switch.

Each of the switches 882 can have a capacitive input impedance, as illustrated in FIG. 12.

Since, for example, each of the buffer outputs 1087 may be an inverter that drives a current, all of the buffer outputs 1087 can be shorted, and all of the buffer outputs 1087 can be connected to the output 190 or to the secondary circuit 895, for instance to a transformer or a load. Each of the inverters can be implemented in examples as a small-signal amplifier, in which an output current is proportional to the voltage of a signal, for instance of the switch input signal 1087, which is applied to the gates, i.e. $i_{out}=g_m*v_{gs}$, where $i_{out}$ is the output current, $v_{gs}$ is the switch input signal 1089 and $g_m$ is a gain. An amplitude of the associated sub-signal can be controlled by adjusting the gain $g_m$, for instance in order to adjust the scaling factors, as described in connection with Tab. 1.

In other words, the phase shifter 100, 800, 900 can be implemented by means of programmable capacitive voltage dividers in an in-phase signal path and a quadrature signal path having a limited capacitance range that covers narrow phase sectors of an entire period in the constellation diagram (I/Q diagram). The output signals from the voltage dividers are summated, for example, by inverters, and do not require stacking of transistors, as is normally required in Gilbert cells. The phase shifters 100, 800, 900 can hence be implemented in nm CMOS technology.

Using the capacitive voltage dividers 270 to implement the phase shifter 100, 400, 500, 800, 900, and the inverter stages 1088 to implement the switches 882, is particularly power-efficient. In examples, the power consumption can be zero or very low. This may be the case in particular if the secondary circuit 895 has a very high impedance.

Figure 13:
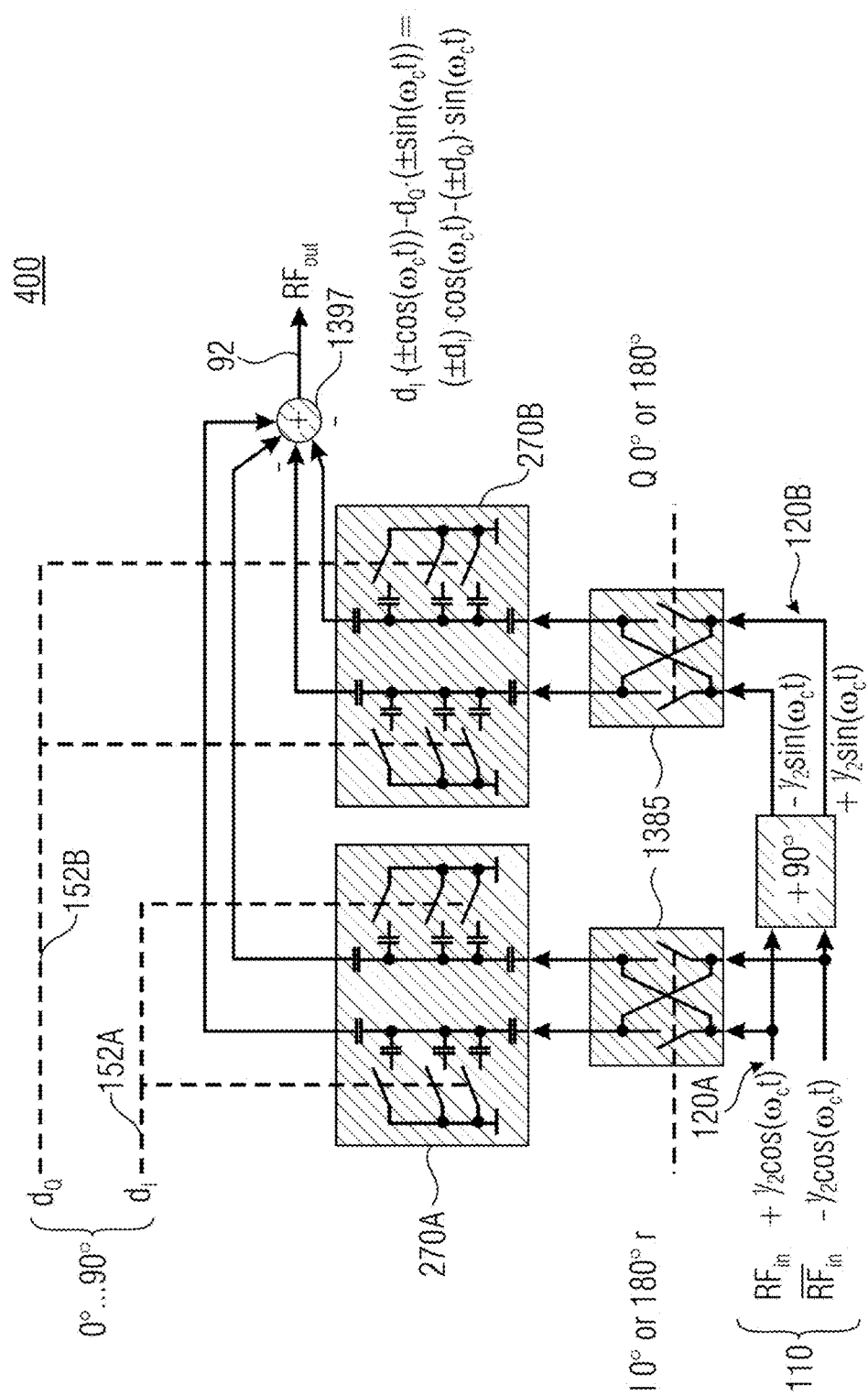
FIG. 13 shows a schematic diagram of a further example of a phase shifter.

FIG. 13 shows a schematic diagram of an example of the phase shifter 400 having differential signal-routing. The first and second signal paths 120A (I path), 120B (Q path) each comprise a sub-signal path in each of which is connected a sub-signal phase switch 1395. The sub-signal phase switches are each designed to invert the respective sub-signals in order to shift the phase of the respective sub-signals by half a period, i.e. by a fixed phase shift through 0° or 180° in the respective signal paths I and Q. Amplitude adjustment signals 152A, 152B each adjust an attenuation of an associated passive attenuator 270A, 270B, for instance of a voltage divider, for the first and second sub-signals of the respective signal paths 120A, 120B, e.g. an I attenuation and a Q attenuation. This example of the phase shifter 400 also comprises a combiner 1397, which is designed to sum the sub-signals in order to obtain the output signal 192 in single-ended signal form. In this example, the passive attenuators 270A, 270B are designed to adjust the amplitudes of the first and second sub-signals such that, for a fixed setting of the sub-signal phase switches 1395, it is possible to adjust the signal available at the combiner 1397 within a range comprising 90° or approximately 90°, for instance in an interval of [0°; 90°]. By means of the adjustable combinations of the sub-signal phase switches 1385, it is possible to select a quadrant containing the phase shift of the signal 192 available at the combiner 1397.

Figure 14A:
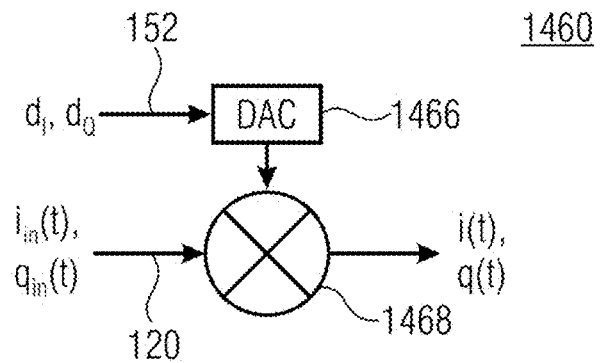
FIG. 14A shows a schematic diagram of an example of an I/Q modulator.

FIG. 14A shows a schematic diagram of an example of an I/Q modulator 1460. The I/Q Modulator 1460 can be an implementation variant for the amplitude adjustment circuit 560 or the amplitude adjustment units 570. The I/Q modulator 1460 comprises a digital-to-analog converter 1466 and a mixer 1468.

Figure 14B:
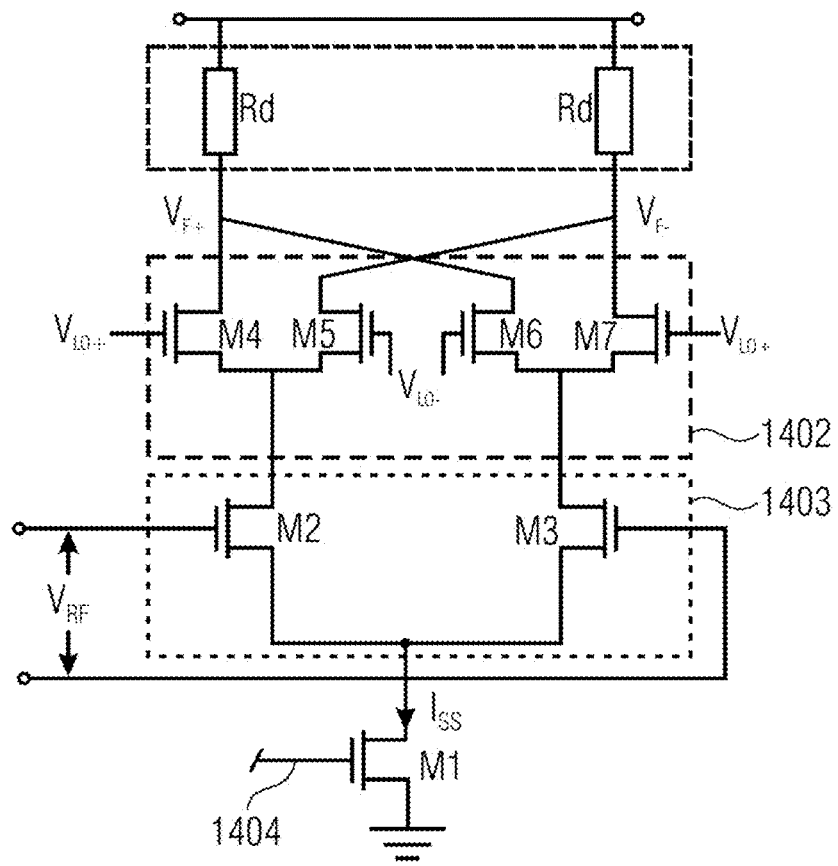
FIG. 14B shows a circuit diagram of an example of a mixer.

FIG. 14B shows an example of the mixer 1468 in the form of an example of a Gilbert cell 1400, which is implemented as a stack of differential amplifiers. The Gilbert cell 1400 comprises a load stage 1401, a switching stage 1402, and a transconductance stage 1403. A bias voltage 1404 can be used to adjust a tail current.

The voltage-divider circuit 160, in particular when implemented using capacitances, has the advantage over the I/Q modulator 1460 that it does not need any active transistors in the linear region, which means lower noise. For the same reason, the voltage-divider circuit 160 is more robust with respect to temperature variations. The voltage-divider circuit 160 can need far less temperature-calibration, for example for 10 K intervals. In addition, the voltage-divider circuit 160 does not rely on high voltages, which means it can be implemented in nm CMOS technology. The voltage-divider circuit 160 thereby provides a particularly high operating speed.

Figure 15:
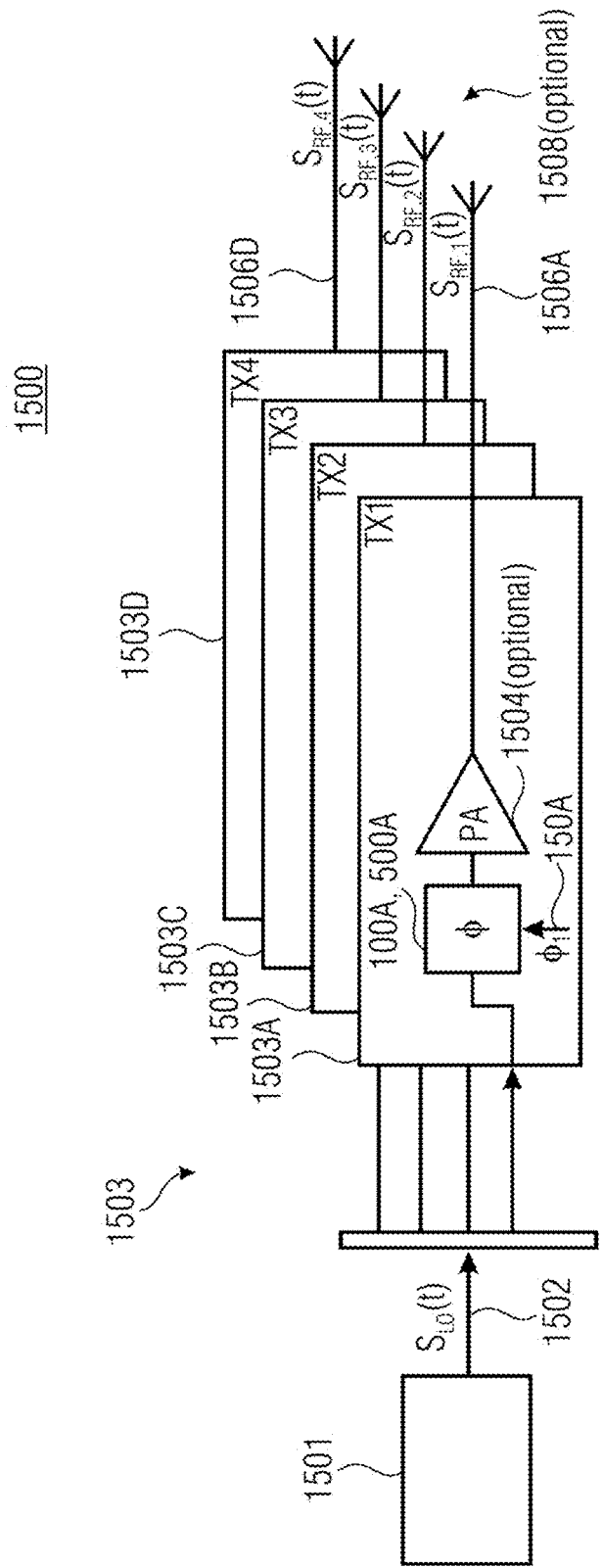
FIG. 15 shows a schematic diagram of an example of a radar transmitter.

FIG. 15 shows a schematic diagram of an example of a radar transmitter 1500. The radar transmitter 1500 comprises an oscillator 1501 designed to provide a local oscillator signal 1502. The oscillator 1501 can be implemented as a phase-locked loop (PLL) for example.

The radar transmitter 1500 contains a plurality of transmitter channels 1503A-D, each of which transmitter channels 1503A-D is designed to provide an antenna signal 1506A-D on the basis of the local oscillator signal 1502. The transmitter channels 1503A-D each contain a phase shifter 100, 400, 500, 800, 900, and each of the transmitter channels 1503A-D is designed to provide the local oscillator signal 1502 at the input 110 of the phase shifter, and to provide, on the basis of the output signal 192 from the phase shifter, the antenna signal 1506A-D of the transmitter channel 1503A-D.

In examples, each of the transmitter channels 1503A-D contains a power amplifier (PA) 1504 in order to amplify the output signal 192 from the phase shifter of the associated transmitter channel.

In examples, the power amplifier 1504 is driven in saturation. An amplitude of the antenna signal 1506 can thereby be kept constant. This makes the radar transmitter 1500 insensitive to a variation in the amplitude of the output signal 192. Thus the amplitude adjustment units 570 or the voltage dividers 270 of the phase shifter can have a smaller design for a given resolution. This can be possible for example when it is just the phase, but not the amplitudes, of the antenna signal 1506A-D that is meant to be modulated.

Optionally, each of the transmitter channels 1503A-D comprises an antenna 1508 for producing a radar signal on the basis of the respective antenna signals. Alternatively, the radar transmitter 1500 can provide the antenna signals 1506A-D at a signal output.

The radar transmitter 1500 is designed to provide for each of the phase shifters the corresponding plurality of control signals 150A in order to adjust a phase relationship between the antenna signals 1506A-D.

In other words, the radar transmitter 1500 can produce a local oscillator signal $s_{LO}(t)$ using a phase-locked loop and distribute said signal to a defined number of transmitter channels TX1, TX2, . . . . Each of the TX channels can contain a phase shifter, which can have a digitally programmable phase Φ1, Φ2, . . . , followed by a power amplifier. The amplified output signals $s_{RF,1}(t)$, $s_{RF,1}(t)$ can then be sent to the TX antenna system.

Since the phase shifter 100, 400, 500, 800, 900 can be implemented very economically in terms of power and space and can be implemented on a semiconductor chip while being able to provide very precise adjustment of the phase shift together with a high resolution of the adjustable phase shift, the radar transmitter 1500 is able to produce a very precise radar signal in a highly energy-efficient manner. The resolution and precision (in the sense of required phase with respect to measured phase) are key requirements, and for the example of 77 GHz radar transmitters for automotive applications lie in the region of fractions of one degree to several degrees. These requirements can be met by the phase shifter 100, 400, 500, 800, 900 and the radar transmitter 1500.

Figure 16:
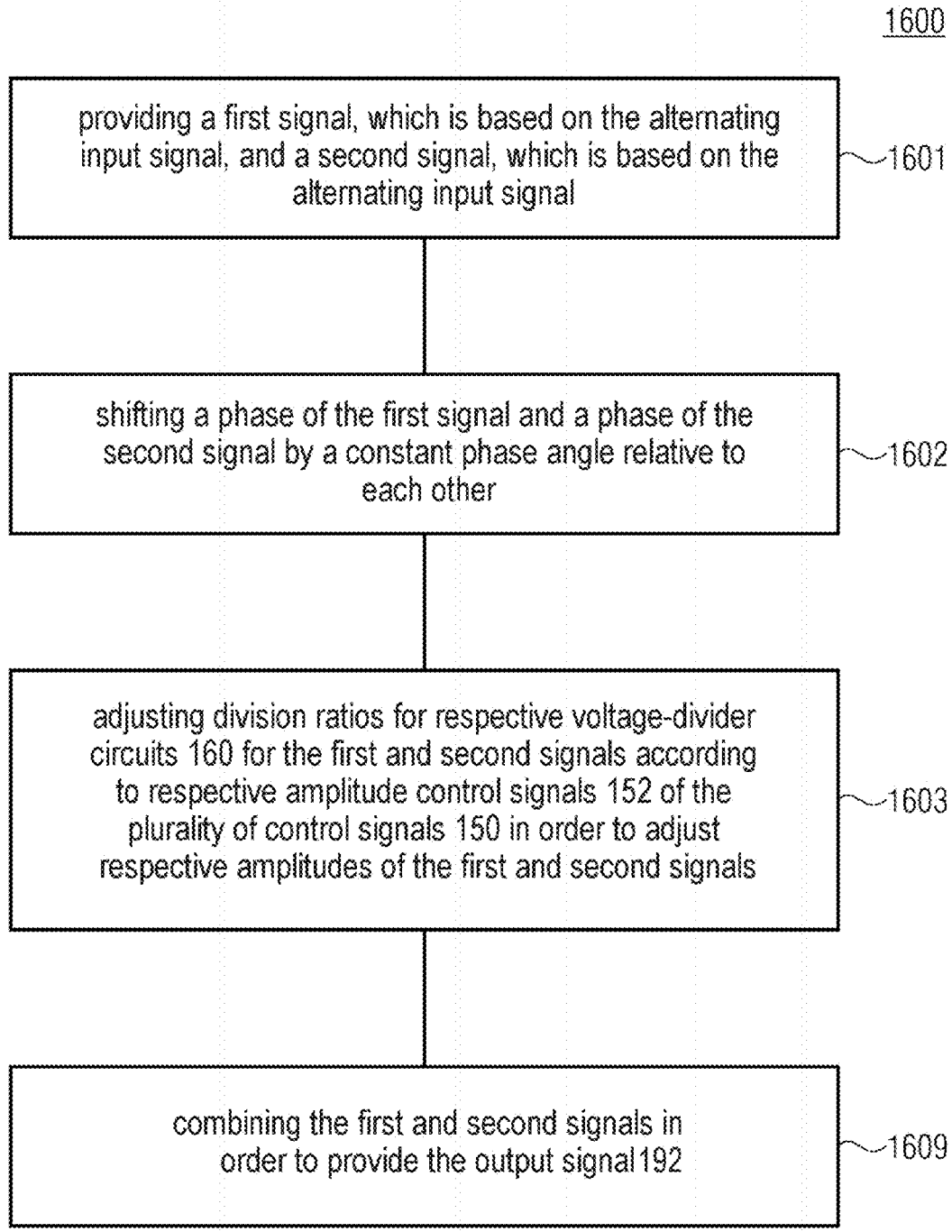
FIG. 16 shows a flow diagram of an example of a method for adjusting a phase shift.

FIG. 16 shows a flow diagram of an example of a method 1600 for adjusting a phase shift between an alternating input signal 112 and an output signal 192 on the basis of a plurality of control signals 150. The method 1600 includes: providing 1601 a first signal, which is based on the alternating input signal, and a second signal, which is based on the alternating input signal; shifting 1602 a phase of the first signal and a phase of the second signal by a constant phase angle relative to each other; adjusting 1603 division ratios for respective voltage-divider circuits 160 for the first and second signals according to respective amplitude control signals 152 of the plurality of control signals 150 in order to adjust respective amplitudes of the first and second signals; combining 1609 the first and second signals in order to provide the output signal 192.

Figure 17:
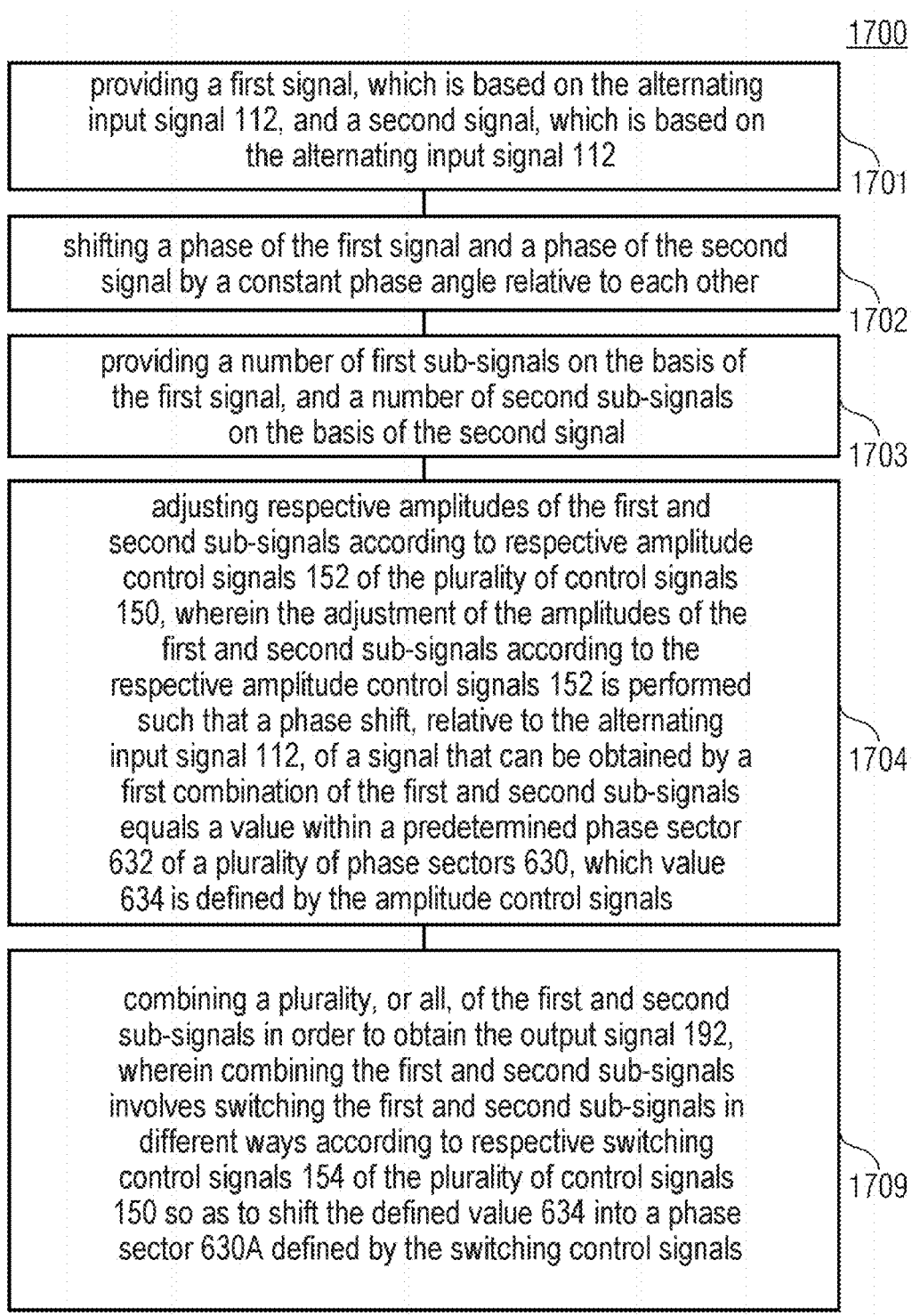
FIG. 17 shows a flow diagram of a further example of a method for adjusting a phase shift.

FIG. 17 shows a flow diagram of an example of a method 1700 for adjusting a phase shift between an alternating input signal 112 and an output signal 192 on the basis of a plurality of control signals 150. The method 1700 includes: providing 1701 a first signal, which is based on the alternating input signal 112, and a second signal, which is based on the alternating input signal 112; shifting 1702 a phase of the first signal and a phase of the second signal by a constant phase angle relative to each other; providing 1703 a number of first sub-signals on the basis of the first signal, and a number of second sub-signals on the basis of the second signal; adjusting 1704 respective amplitudes of the first and second sub-signals according to respective amplitude control signals 152 of the plurality of control signals 150; combining 1709 a plurality, or all, of the first and second sub-signals in order to obtain the output signal 192, wherein the adjustment 1704 of the amplitudes of the first and second sub-signals according to the respective amplitude control signals 152 is performed such that a phase shift, relative to the alternating input signal 112, of a signal that can be obtained by a first combination of the first and second sub-signals equals a value 634 within a predetermined phase sector 632 of a plurality of phase sectors 630, which value is defined by the amplitude control signals, wherein combining 1709 the first and second sub-signals involves switching the first and second sub-signals in different ways according to respective switching control signals 154 of the plurality of control signals 150 so as to shift the defined value 634 into a phase sector 630A defined by the switching control signals.

A method for providing a radar signals includes: providing a local oscillator signal; providing a plurality of antenna signals using the method according to one of the methods 1600, 1700, wherein the local oscillator signal is provided as respective alternating input signals; providing the corresponding plurality of control signals for providing the respective antenna signals in order to adjust a phase relationship between the antenna signals.

In some embodiments, a phase shifter is implemented that provides a phase shift of an alternating signal in a way that advantageously achieves a good compromise between high resolution and high precision of the adjustable phase shift, low power consumption and good suitability for integration into electrical circuits.

Although some aspects of the present disclosure have been described as features relating to a device, it is obvious that such a description can be viewed likewise as a description of corresponding method features. Although some aspects have been described as features relating to a method, it is obvious that such a description can be viewed also as a description of corresponding features of a device, or of the functionality of a device.

Although methods may be presented as a sequence of steps for illustrative purposes, it should be pointed out that the steps of the presented method can also be performed in an order other than that shown, simultaneously and/or in overlap, provided there is no conflict with the described causal sequence.

In the detailed description above, different features have been grouped together in some examples in order to rationalize the disclosure. This form of disclosure shall not be interpreted as intending that the claimed examples comprise more features than explicitly stated in each claim. Instead, as the following claims reflect, the subject matter can lie in fewer than all the features of an individual disclosed example. Consequently, the following claims are hereby incorporated in the detailed description, where each claim can stand alone as a separate example in its own right. Although each claim can stand alone as a separate example in its own right, it should be noted that, even though dependent claims can refer in the claims to a specific combination with one or more other claims, other examples can also include a combination of dependent claims with the subject matter of every other dependent claim or a combination of every feature with other dependent or independent claims. Such combinations are included unless it is stated that a specific combination is not intended. In addition, it is intended that also a combination of features of one claim with every other independent claim is included even if this claim is not directly dependent on the independent claim.

The exemplary embodiments described above merely illustrate the principles of the present disclosure. Of course modifications and variations to the arrangements and details described here will be obvious to other persons skilled in the art. Thus the intention is that the disclosure is limited by the scope of protection of the following claims and not by the specific details that have been presented in this document by the description and explanation of the exemplary embodiments.

What is claimed is:

1. A phase shifter for adjusting, based on a plurality of control signals, a phase shift between an alternating input signal present at an input of the phase shifter, and an output signal of the phase shifter provided at an output of the phase shifter, the phase shifter comprising:
    a first signal path between the input and the output;
    a second signal path between the input and the output; and
    a phase-shifter circuit configured to shift a phase of a first signal of the first signal path and a phase of a second signal of the second signal path by a constant phase angle relative to each other,
    wherein the first and second signal paths each comprise a voltage-divider circuit connected to its respective signal path and configured to adjust an amplitude of a signal of the respective signal path according to a respective amplitude control signal of the plurality of control signals,
    wherein the voltage-divider circuit comprises one or more voltage dividers that each include a first capacitance connected to the respective signal path, and an adjustable second capacitance connected between the respective signal path and a reference potential, wherein the adjustable second capacitance is configured to adjust an amplitude of the signal of the respective signal path based on a ratio between the first capacitance and the adjustable second capacitance,
    wherein the output signal is based on a combination of the first signal and the second signal.

2. The phase shifter as claimed in claim 1, wherein the adjustable second capacitance of the one or more voltage dividers each comprise a plurality of sub-capacitances configured to connected selectively, in parallel with one another, between the respective signal path and the reference potential.

3. The phase shifter as claimed in claim 1,
    wherein the first signal path comprises a number of parallel-connected first sub-signal paths for respective first sub-signals, wherein first sub-signals of the first sub-signal paths are based on the first signal,
    wherein the second signal path comprises a number of parallel-connected second sub-signal paths for respective second sub-signals, wherein second sub-signals of the second sub-signal paths are based on the second signal,
    wherein the first sub-signal path and the second sub-signal paths each comprises a voltage divider of the voltage-divider circuit, and each respective voltage divider is configured to adjust an amplitude of its respective sub-signal according to respective amplitude control signals of the plurality of control signals.

4. The phase shifter as claimed in claim 3, wherein the voltage dividers in the first sub-signal paths and the second sub-signal paths are configured to adjust amplitudes of the first sub-signals and the second sub-signals such that a phase shift, relative to the alternating input signal, of a signal is obtainable by a first combination of the first sub-signals and second sub-signals is adjustable solely to values within a predetermined phase sector of a plurality of phase sectors.

5. The phase shifter as claimed in claim 4, wherein each of the plurality of phase sectors are smaller than a quarter of an entire period.

6. The phase shifter as claimed in claim 4,
    wherein each of the plurality of phase sectors are an n'th of a quarter period, where n is an even number, and
    wherein the number of first sub-signal paths and the number of second sub-signal paths equals n/2.

7. The phase shifter as claimed in claim 3,
    wherein the output signal is based on a combination of a plurality, or all, of the first sub-signals and the second sub-signals, and
    wherein the phase shifter comprises a combiner circuit configured to switch the first sub-signals and the second sub-signals in different ways according to respective switching control signals of the plurality of control signals in order to adjust a combination of the first sub-signals and the second sub-signals.

8. The phase shifter as claimed in claim 7,
    wherein the voltage dividers in the first sub-signal paths and the second sub-signal paths are configured to adjust amplitudes of the first sub-signals and the second sub-signals according to the respective amplitude control signals such that a phase shift, relative to the alternating input signal, of a signal obtainable by a first combination of the first sub-signals and the second sub-signals equals a first value within a predetermined phase sector, which first value is defined by the respective amplitude control signals, wherein the combiner circuit is configured to switch the first sub-signals and the second sub-signals so as to shift the defined first value into a phase sector defined by the respective switching control signals.

9. A phase shifter for adjusting, based on a plurality of control signals, a phase shift between an alternating input signal present at an input of the phase shifter, and an output signal of the phase shifter provided at an output of the phase shifter, the phase shifter comprising:
a first signal path between the input and the output;
a second signal path between the input and the output; and
a phase-shifter circuit configured to shift a phase of a first signal of the first signal path and a phase of a second signal of the second signal path by a constant phase angle relative to each other,
wherein the first signal path comprises a number of parallel-connected first sub-signal paths for respective first sub-signals, which first sub-signals are based on the first signal,
wherein the second signal path comprises a number of parallel-connected second sub-signal paths for respective second sub-signals, which second sub-signals are based on the second signal,
wherein the first sub-signal paths and second sub-signal paths each comprise an amplitude adjustment circuit, wherein the respective amplitude adjustment circuits are connected to the respective sub-signal paths and are configured to adjust amplitudes of the respective sub-signals according to respective amplitude control signals of the plurality of control signals,
wherein the output signal is based on a combination of a plurality, or all, of the first sub-signals and the second sub-signals, and
wherein the phase shifter comprises a combiner circuit configured to switch the first sub-signals and the second sub-signals in different ways according to respective switching control signals of the plurality of control signals in order to adjust the combination of the first sub-signals and the second sub-signals,
wherein the amplitude adjustment circuits in the first sub-signal paths and the second sub-signal paths are configured to adjust the amplitudes of the first sub-signals and the second sub-signals according to the respective amplitude control signals such that a phase shift, relative to the alternating input signal, of a signal obtainable by a first combination of the first sub-signals and the second sub-signals equals a first value within a predetermined phase sector of a plurality of phase sectors, which first value is defined by the respective amplitude control signals, and
wherein the combiner circuit is designed to switch the first sub-signals and the second sub-signals so as to shift the defined first value into a phase sector defined by the respective switching control signals.

10. The phase shifter as claimed in claim 9, wherein the combiner circuit contains a plurality of sub-signal phase switches, which sub-signal phase switches are connected respectively in the first sub-signal paths or the second sub-signal paths and are configured to selectively shift a phase of its respective sub-signals by a half period according to the respective switching control signals and in order to switch a contribution of the respective sub-signals to the output signal.

11. The phase shifter as claimed in claim 9, wherein the first sub-signal paths and the second sub-signal paths each comprise a sub-signal phase switch configured to shift a phase of its respective sub-signals selectively by a half period according to a respective phase-control signals of the plurality of control signals.

12. The phase shifter as claimed in claim 11,
wherein the first sub-signal paths and the second sub-signal paths are differential signal paths, and
wherein the sub-signal phase switch of the respective sub-signal paths is configured to invert its associated sub-signal according to the respective switching control signal or phase-control signal in order to selectively shift the phase of the associated sub-signal by a half period.

13. The phase shifter as claimed in claim 9, wherein, the phase shifter is integrated in an integrated circuit.

14. A radar transmitter comprising:
an oscillator configured to provide a local oscillator signal; and
a plurality of transmitter channels configured to provide an antenna signal based on the local oscillator signal,
wherein the transmitter channels each comprise the phase shifter as claimed in claim 10,
wherein each of the transmitter channels is designed to provide the local oscillator signal at the input of the phase shifter, and to provide, based on the output signal from the phase shifter, the antenna signal of the transmitter channel,
wherein the radar transmitter is designed to provide the corresponding plurality of control signals for each of the phase shifters in order to adjust a phase relationship between the antenna signals.

15. A method for adjusting a phase shift between an alternating input signal and an output signal based on a plurality of control signals, comprising:
providing a first signal based on the alternating input signal, and a second signal based on the alternating input signal;
providing a first number of first sub-signals based on the first signal, and a second number of second sub-signals based on the second signal;
shifting a phase of the first signal and a phase of the second signal by a constant phase angle relative to each other;
adjusting amplitudes of the first signal and the second signal by:
adjusting division ratios for respective voltage-divider circuits for the first sub-signals, and the second sub-signals according to respective amplitude control signals of the plurality of control signals, such that a phase shift, relative to the alternating input signal, of a signal obtainable by a first combination of the first sub-signals and the second sub-signals equals a first value within a predetermined phase sector of a plurality of phase sectors, wherein the first value is defined by the respective amplitude control signals; and
combining the first sub-signals and the second sub-signals comprises by switching the first sub-signals and the second sub-signals in different ways according to respective switching control signals of the plurality of control signals so as to shift the first value into a phase sector defined by the respective switching control signals.

16. The method as claimed in claim 15, wherein:

each respective voltage divider circuit for the first sub-signals and the second sub-signals comprises a first capacitance and an adjustable second capacitance connected between the first capacitance and a reference potential; and adjusting the division ratios comprises adjusting the second capacitance of at least one of the respective voltage divider circuits.

17. The method of claim 16, wherein:

the adjustable second capacitance comprise a plurality of sub-capacitances; and adjusting the second capacitance of the at least one of the respective voltage divider circuits comprises selectively connecting one or more of the plurality of sub-capacitances in parallel with each other.

18. A method for adjusting a phase shift between an alternating input signal and an output signal based on a plurality of control signals, the method comprising:

providing a first signal based on the alternating input signal;

providing a second signal based on the alternating input signal;

shifting a phase of the first signal and a phase of the second signal by a constant phase angle relative to each other;

providing a number of first sub-signals based on the first signal, and a number of second sub-signals based on the second signal;

adjusting respective amplitudes of the first sub-signals and the second sub-signals according to respective amplitude control signals of the plurality of control signals; and combining a plurality, or all, of the first sub-signals and the second sub-signals in order to obtain the output signal, wherein the adjustment of the respective amplitudes of the first sub-signals and the second sub-signals according to the respective amplitude control signals is performed such that a phase shift, relative to the alternating input signal, of a signal obtainable by a first combination of the first sub-signals and the second sub-signals equals a first value within a predetermined phase sector of a plurality of phase sectors, which first value is defined by the respective amplitude control signals, and wherein combining the first sub-signals and the second sub-signals comprises switching the first sub-signals and the second sub-signals in different ways according to respective switching control signals of the plurality of control signals to shift the defined first value into a phase sector defined by the respective switching control signals.

19. The method as claimed in claim 18, wherein:

providing the number of the first sub-signals and the number of the second sub-signals comprises using respective voltage dividers that each include a first capacitance and an adjustable second capacitance connected between the first capacitance and a reference potential; and adjusting the respective amplitudes of the first sub-signals and the second sub-signals comprises adjusting the second capacitance of at least one of the respective voltage dividers.

20. The method of claim 19, wherein:

the adjustable second capacitance comprise a plurality of sub-capacitances; and adjusting the second capacitance of the at least one of the respective voltage dividers comprises selectively connecting one or more of the plurality of sub-capacitances in parallel with each other.

\* \* \* \* \*